United States Patent
Ito et al.

(10) Patent No.: US 9,912,119 B2
(45) Date of Patent: Mar. 6, 2018

(54) QUANTUM CASCADE LASER

(71) Applicant: HAMAMATSU PHOTONICS K.K., Hamamatsu-shi, Shizuoka (JP)

(72) Inventors: Akio Ito, Hamamatsu (JP); Tatsuo Dougakiuchi, Hamamatsu (JP); Kazuue Fujita, Hamamatsu (JP); Tadataka Edamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/253,382

(22) Filed: Aug. 31, 2016

(65) Prior Publication Data
US 2017/0063038 A1 Mar. 2, 2017

(30) Foreign Application Priority Data
Aug. 31, 2015 (JP) .................. 2015-170253

(51) Int. Cl.
*H01S 5/24* (2006.01)
*H01S 5/14* (2006.01)
(Continued)

(52) U.S. Cl.
CPC ............ *H01S 5/142* (2013.01); *H01S 5/0604* (2013.01); *H01S 5/1092* (2013.01); *H01S 5/24* (2013.01);
(Continued)

(58) Field of Classification Search
CPC ........ H01S 5/2018; H01S 5/2027; H01S 5/24; H01S 5/3401; H01S 5/3402; H01S 5/0604; H01S 2302/02
See application file for complete search history.

(56) References Cited

U.S. PATENT DOCUMENTS

2009/0262774 A1* 10/2009 Long .............. H01S 5/146
372/49.01
2011/0286486 A1* 11/2011 Fujita .............. B82Y 20/00
372/45.01

FOREIGN PATENT DOCUMENTS

JP H08-279647 A 10/1996
JP 09-146131 * 6/1997
(Continued)

OTHER PUBLICATIONS

S. Fathololoumi et al., "Terahertz quantum cascade lasers operating up to ~ 200 K with optimized oscillator strength and improved injection tunneling", Optics Express, vol. 20, 2012, p. 3866-p. 3876.
(Continued)

*Primary Examiner* — Tod T Van Roy
(74) *Attorney, Agent, or Firm* — Drinker Biddle & Reath LLP

(57) ABSTRACT

A quantum cascade laser is configured with a semiconductor substrate, and an active layer having a multistage lamination of emission layers and injection layers. The active layer is configured to be capable of generating first pump light of a frequency $\omega_1$ and second pump light of a frequency $\omega_2$, and to generate output light of a difference frequency $\omega$ by difference frequency generation. An external diffraction grating is provided for generating the first pump light, outside an element structure portion including the active layer, and an internal diffraction grating is provided for generating the second pump light, inside the element structure portion. The frequency $\omega_2$ is set to be fixed to a frequency not coincident with a gain peak, and the frequency $\omega_1$ is set to be variable to a frequency different from the frequency $\omega_2$.

3 Claims, 16 Drawing Sheets

(51) Int. Cl.
*H01S 5/34* (2006.01)
*H01S 5/06* (2006.01)
*H01S 5/10* (2006.01)
*H01S 5/12* (2006.01)
*H01S 5/02* (2006.01)

(52) U.S. Cl.
CPC .......... *H01S 5/3402* (2013.01); *H01S 5/0207* (2013.01); *H01S 5/12* (2013.01); *H01S 2302/02* (2013.01)

(56) References Cited

FOREIGN PATENT DOCUMENTS

| JP | 2010-521815 A | 6/2010 |
|---|---|---|
| JP | 2011-035139 A | 2/2011 |
| JP | 2011-243781 A | 12/2011 |
| JP | 2013-098251 A | 5/2013 |
| WO | WO-2008/143737 A2 | 11/2008 |
| WO | WO-2014/018599 A1 | 1/2014 |

OTHER PUBLICATIONS

Y. Jiang et al., "External cavity terahertz quantum cascade laser sources based on intra-cavity frequency mixing with 1.2-5.9THz tuning range", J. Opt, vol. 16, 094002, 2014, p. 1-p. 9.

R Köhler et al., "Terahertz semiconductor-heterostructure laser", Nature, vol. 417, 2002, p. 156-p. 159.

Q.Y. Lu et al., "Room temperature single-mode terahertz sources based on intracavity difference-frequency generation in quantum cascade lasers", Applied Physics Letters, vol. 99, 2011, p. 131106-1-p. 131106-3.

Q.Y. Lu et al., "Widely tuned room temperature terahertz quantum cascade laser sources based on difference-frequency generation", Applied Physics Letters, vol. 101, 2012, p. 251121-1-p. 251121-4.

Q.Y. Lu et al., "Room temperature terahertz quantum cascade laser sources with 215μW output power through epilayer-down mounting", Applied Physics Letters, vol. 103, 2013, p. 011101-1-p. 011101-4.

Q.Y. Lu et al, "Continuous operation of a monolithic semiconductor terahertz source at room temperature", Applied Physics Letters, vol. 104, 2014, p. 221105-1-p. 221105-5.

C. Pflügl et al., "Surface-emitting terahertz quantum cascade laser source based on intracavity difference-frequency generation", Applied Physics Letters, vol. 93, 2008, p. 161110-1-p. 161110-3.

K. Vijayraghavan et al., "Terahertz sources based on Čerenkov difference-frequency generation in quantum cascade lasers", Applied Physics Letters, vol. 100, 2012, p. 251104-1-p. 251104-4.

K. Vijayraghavan et al., "Broadly tunable terahertz generation in mid-infrared quantum cascade lasers", Nature Communications, vol. 4, Art. 2021, 2013, p. 1-p. 7.

U.S. Office Action dated Feb. 6, 2017 that issued in U.S. Appl. No. 15/193,249 including Double Patenting Rejections on pp. 2-3.

U.S. Office Action dated Feb. 6, 2017 that issued in U.S. Appl. No. 15/251,119 including Double Patenting Rejections on pp. 2-4.

* cited by examiner

*Fig.11*

| SEMICONDUCTOR LAYER | | COMPOSITION | LAYER THICKNESS | DOPING |
|---|---|---|---|---|
| INJECTION BARRIER LAYER 171 | | InAlAs | 3.8nm | undoped |
| EMISSION LAYER 17 | WELL LAYER 161 | InGaAs | 3.8nm | undoped |
| | BARRIER LAYER 172 | InAlAs | 2.3nm | undoped |
| | 162 | InGaAs | 8.5nm | undoped |
| | 173 | InAlAs | 1.0nm | undoped |
| | 163 | InGaAs | 6.9nm | undoped |
| | 174 | InAlAs | 1.1nm | undoped |
| | 164 | InGaAs | 5.6nm | undoped |
| EXIT BARRIER LAYER 191 | | InAlAs | 1.2nm | undoped |
| INJECTION LAYER 18 | WELL LAYER 181 | InGaAs | 4.8nm | undoped |
| | BARRIER LAYER 192 | InAlAs | 1.3nm | undoped |
| | 182 | InGaAs | 4.5nm | undoped |
| | 193 | InAlAs | 1.4nm | undoped |
| | 183 | InGaAs | 4.2nm | undoped |
| | 194 | InAlAs | 1.6nm | Si doped: $9 \times 10^{16}/cm^3$ |
| | 184 | InGaAs | 4.1nm | Si doped: $9 \times 10^{16}/cm^3$ |
| | 195 | InAlAs | 1.8nm | Si doped: $9 \times 10^{16}/cm^3$ |
| | 185 | InGaAs | 4.0nm | Si doped: $9 \times 10^{16}/cm^3$ |
| | 196 | InAlAs | 2.3nm | undoped |
| | 186 | InGaAs | 4.0nm | undoped |
| | 197 | InAlAs | 2.6nm | undoped |
| | 187 | InGaAs | 4.0nm | undoped |

# QUANTUM CASCADE LASER

BACKGROUND OF THE INVENTION

Field of the Invention

The present invention relates to a quantum cascade laser using intersubband transitions in a quantum well structure.

Related Background Art

Light in a mid-infrared wavelength range (for example, wavelengths of 5 to 30 μm) is an important wavelength range in the field of spectrometric analysis. As a high-performance semiconductor light source in this wavelength range, attention has been attracted to quantum cascade lasers (QCL) in recent years (e.g., cf. Patent Documents 1 to 3).

The quantum cascade laser is a monopolar type laser element which uses a level structure including subbands formed in a semiconductor quantum well structure, to generate light by transitions of electrons between the subbands, wherein quantum well emission layers, each of which is formed in the quantum well structure and serves as an active region, are cascade-coupled in multiple stages, thereby enabling realization of high-efficiency and high-output operation. This cascade coupling of the quantum well emission layers is realized by use of electron injection layers for injecting electrons into emission upper levels, so as to alternately stack the quantum well emission layers and the injection layers.

Patent Document 1: International Publication No. WO 2014/018599
Patent Document 2: Japanese Patent Application Laid-Open Publication No. H8-279647
Patent Document 3: Japanese Patent Application Laid-Open Publication No. 2010-521815
Patent Document 4: Japanese Patent Application Laid-Open Publication No. 2011-035139
Patent Document 5: Japanese Patent Application Laid-Open Publication No. 2011-243781
Patent Document 6: Japanese Patent Application Laid-Open Publication No. 2013-098251
Non Patent Document 1: K. Vijayraghavan et al., "Terahertz sources based on Cerenkov difference-frequency generation in quantum cascade lasers", Appl. Phys. Lett. Vol. 100 (2012) pp. 251104-1-251104-4
Non Patent Document 2: K. Vijayraghavan et al., "Broadly tunable terahertz generation in mid-infrared quantum cascade lasers", Nat. Commun. Vol. 4 Art. 2021 (2013) pp. 1-7
Non Patent Document 3: R. Kohler et al., "Terahertz semiconductor-heterostructure laser", NATURE Vol. 417 (2002) pp. 156-159
Non Patent Document 4: S. Fathololoumi et al., "Terahertz quantum cascade lasers operating up to ~200 K with optimized oscillator strength and improved injection tunneling", Optics Express Vol. 20 (2012) pp. 3866-3876
Non Patent Document 5: Q. Y. Lu et al., "Room temperature single-mode terahertz sources based on intracavity difference-frequency generation in quantum cascade lasers", Appl. Phys. Lett. Vol. 99 (2011) 131106-1-131106-3
Non Patent Document 6: Q. Y. Lu et al., "Widely tuned room temperature terahertz quantum cascade laser sources based on difference-frequency generation", Appl. Phys. Lett. Vol. 101 (2012) pp. 251121-1-251121-4
Non Patent Document 7: Q. Y. Lu et al., "Room temperature terahertz quantum cascade laser sources with 215 W output power through epilayer-down mounting", Appl. Phys. Lett. Vol. 103 (2013) pp. 011101-1-011101-4
Non Patent Document 8: Q. Y. Lu et al., "Continuous operation of a monolithic semiconductor terahertz source at room temperature", Appl. Phys. Lett. Vol. 104 (2014) pp. 221105-1-221105-5
Non Patent Document 9: C. Pflugl et al., "Surface-emitting terahertz quantum cascade laser source based on intracavity difference-frequency generation", Appl. Phys. Lett. Vol. 93 (2008) pp. 161110-1-161110-3
Non Patent Document 10: Y. Jiang et al., "External cavity terahertz quantum cascade laser sources based on intracavity frequency mixing with 1.2-5.9 THz tuning range", J. Opt Vol. 16 (2014) 094002 pp. 1-9

SUMMARY OF THE INVENTION

The quantum cascade laser was first successfully lased in 1994 and since then, the lasing wavelength thereof has been actively increased toward longer wavelengths; in 2002, R. Kohler et al. reported the lasing in the terahertz (THz) band (Non Patent Document 3: NATURE Vol. 417 (2002) pp. 156-159). The terahertz band is a so-called far-infrared region of around 100 μm in terms of wavelength, for example, wavelength of from about 60 μm to 300 μm, which is a range corresponding to the boundary between radio waves and light. Since the terahertz light (terahertz wave) has the feature of possessing both of transmitting property of radio wave and rectilinearity of light, application thereof as unprecedented sensing means is under research in various fields including the medical biology, security, communication, cosmic observation, and so on.

It was hard for the semiconductor lasers of conventional structures to realize the increase in wavelength up to the terahertz band, but the quantum cascade lasers have realized lasing in the terahertz band as described above. However, it is the present status that the laser operation is still limited to an extremely-low temperature environment using liquid nitrogen, and there are problems in effectiveness to industrial application.

For example, S. Fathololoumi et al. (Non Patent Document 4: Optics Express Vol. 20 (2012) pp. 3866-3876) reported the maximum operating temperature ~200K at the oscillation frequency of 2.85 THz in the configuration wherein the active layer is configured by cascade coupling of triple quantum well structures of $GaAs/Al_xGa_{1-x}As$ (x=0.15). However, the status quo method is in a situation where it is very difficult to achieve higher-temperature operation.

On the other hand, M. A. Belkin et al. have succeeded in generating the terahertz light (THz light) by difference frequency generation (DFG) through the use of two-wavelength oscillation type mid-infrared QCL and the second order nonlinear optical effect in the QCL (Patent Document 3: Japanese Patent Application Laid-Open Publication No. 2010-521815). It was already confirmed that the QCL for generating the terahertz light by this configuration (DFG-THz-QCL) was able to operate at a room temperature, and further improvement in characteristics is expected.

Recently, a group in Northwestern University also reported the DFG-THz-QCL (Non Patent Document 5: Appl. Phys. Lett. Vol. 99 (2011) 131106-1-131106-3, Non Patent Document 6: Appl. Phys. Lett. Vol. 101 (2012) pp. 251121-1-251121-4, Non Patent Document 7: Appl. Phys. Lett. Vol. 103 (2013) pp. 011101-1-011101-4). Most recently, room temperature continuous operation at a level of average light output μW has been realized, and the peak light output at a level of mW in the room temperature pulse operation is also reported; however, it is in a situation where a large electric current of 10 A or more is necessary, and further improvement in characteristics is demanded (Non Patent Document 8: Appl. Phys. Lett. Vol. 104 (2014) pp. 221105-1-221105-5).

Currently, in such a THz-QCL, in order to realize high extraction efficiency of the terahertz light, a method is used applying Cerenkov phase matching, and, for example, a configuration is used in which an element end face polished at an angle of about 20° or 30° serves as an output end face of the terahertz light (e.g., cf. Patent Document 1: International Publication No. WO 2014/018599, Non Patent Document 1: Appl. Phys. Lett. Vol. 100 (2012) pp. 251104-1-251104-4, Non Patent Document 2: Nat. Commun. Vol. 4 Art. 2021 (2013) pp. 1-7). As a result, terahertz light output at a level of μW has been realized; however, a sufficient output for practical use has not been obtained.

In the THz-QCL, an extraction method has been studied of the terahertz light output from an element surface using a metal grating. However, in this configuration, there are problems such as loss of the light due to the metal, and that mode coupling efficiency is not optimized to the terahertz light; currently, a better terahertz output characteristics than the QCL using Cerenkov phase matching has not been obtained (Non Patent Document 9: Appl. Phys. Lett. Vol. 93 (2008) pp. 161110-1-161110-3).

In association with the above-described configuration in which the element end face is polished at a predetermined angle and serves as the output end face of the terahertz light, a configuration has been proposed in which one wavelength of mid-infrared pump light components of two wavelengths to be used for difference frequency generation is made to be variable by using an external cavity with a diffraction grating in a cavity structure of a laser element, to make the wavelength of the terahertz light variable (Non Patent Document 2: Nat. Commun. Vol. 4 Art. 2021 (2013) pp. 1-7, Non Patent Document 10: J. Opt Vol. 16 (2014) 094002 pp. 1-9). However, even in this configuration, sufficient characteristics has not been obtained regarding generation, output of the terahertz light.

The present invention has been made in order to solve the above problem, and an object thereof is to provide a quantum cascade laser capable of suitably generating, outputting light such as the terahertz light by the difference frequency generation.

In order to achieve the above object, the quantum cascade laser according to the present invention includes (1) a semiconductor substrate; and (2) an active layer provided on a first surface of the semiconductor substrate and having a cascade structure in which quantum well emission layers and injection layers are alternately stacked in the form of a multistage lamination of unit laminate structures each of which includes the quantum well emission layer and the injection layer, wherein (3) the active layer is configured with a single active layer structure, and the unit laminate structure includes a first emission upper level, a second emission upper level having a higher energy than the first emission upper level, and a plurality of emission lower levels each of which has a lower energy than the first emission upper level, in a subband level structure by a quantum well structure, and (4) the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light, and (5) an external diffraction grating is provided constituting an external cavity for generating the first pump light by feeding the light of the first frequency $\omega_1$ back to an element structure portion and configured to be capable of changing the first frequency $\omega_1$, outside the element structure portion including the active layer provided on the first surface of the semiconductor substrate, and an internal diffraction grating is provided constituting a distributed feedback cavity for generating the second pump light of the second frequency $\omega_2$, inside the element structure portion, and (6) the second frequency $\omega_2$ determined by the internal diffraction grating is set to be fixed to a frequency not coincident with a gain peak in a gain spectrum, and the first frequency $\omega_1$ determined by the external diffraction grating is set to be variable to a frequency different from the second frequency $\omega_2$.

In the above-described quantum cascade laser, the active layer is configured to be capable of generating light components of two frequencies of the first pump light of the first frequency (angular frequency, hereinafter simply referred to as frequency) $\omega_1$ and the second pump light of the second frequency $\omega_2$. In this configuration, for example, long-wavelength output light such as the terahertz light can be generated as light of a difference frequency $\omega=|\omega_1-\omega_2|$ by using the difference frequency generation by the first pump light and the second pump light.

The external diffraction grating is provided constituting the external cavity for generating the first pump light, outside the element structure portion being a semiconductor laminate structure provided on the first surface of the semiconductor substrate including the active layer, and the internal diffraction grating is provided constituting the distributed feedback cavity for generating the second pump light, inside the element structure portion, and the external diffraction grating is configured to be capable of changing the first frequency $\omega_1$ of the light resonating in the external cavity. In this configuration, by changing the frequency $\omega_1$ of the first pump light, the frequency $\omega$ can be made to be variable of the output light such as the terahertz light generated by the difference frequency generation.

In the above configuration, the active layer generating the first pump light and the second pump light is configured with a single type of active layer structure, and, specifically, two emission upper levels of the first and second emission upper levels, and the plurality of (two or more) emission lower levels are provided, as levels relating to emission, in the subband level structure in the unit laminate structure configured with the emission layer and the injection layer. In this way, according to the configuration in which two emission upper levels and two or more emission lower levels are combined, a unimodal and wide band emission spectrum (gain spectrum of emission) can be obtained with the single active layer structure, by appropriately setting energy intervals between the levels and the like. Thus, the first pump light and the second pump light having different frequencies from each other can be suitably generated in the active layer.

Further, for the active layer having such a level structure, the second frequency $\omega_2$ in the distributed feedback cavity with the internal diffraction grating is set to be fixed to the frequency different from the gain peak, and the first frequency $\omega_1$ in the external cavity with the external diffraction grating is set to be variable to the frequency different from the second frequency $\omega_2$. Thus, generation of the first pump light and the second pump light, and generation of the output light such as the terahertz light by the difference frequency generation can be suitably achieved.

According to the quantum cascade laser of the present invention, the first and second emission upper levels, and the plurality of emission lower levels are provided in the subband level structure in the unit laminate structure of the active layer using the single active layer structure; the active layer is configured to be capable of generating the first pump light of the first frequency $\omega_1$ and the second pump light of the second frequency $\omega_2$, and to generate the output light of the difference frequency $\omega$ by the difference frequency generation from the first pump light and the second pump light; the external diffraction grating is provided constituting the external cavity for generating the first pump light and configured to be capable of changing the first frequency $\omega_1$, outside the element structure portion including the active layer, the internal diffraction grating is provided constituting the distributed feedback cavity for generating the second pump light, inside the element structure portion; the second frequency $\omega_2$ by the internal diffraction grating is set to be fixed to the frequency $\omega_1$ different from the frequency of the gain peak and the first frequency $\omega_1$ by the external diffraction grating is set to be variable to the frequency different from the second frequency $\omega_2$, so that the light such as the terahertz light can be suitably generated and output by the difference frequency generation.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 11 is a table showing an example of a structure of the unit laminate structure of one period in the active layer.

DESCRIPTION OF THE EMBODIMENTS

Figure 1:
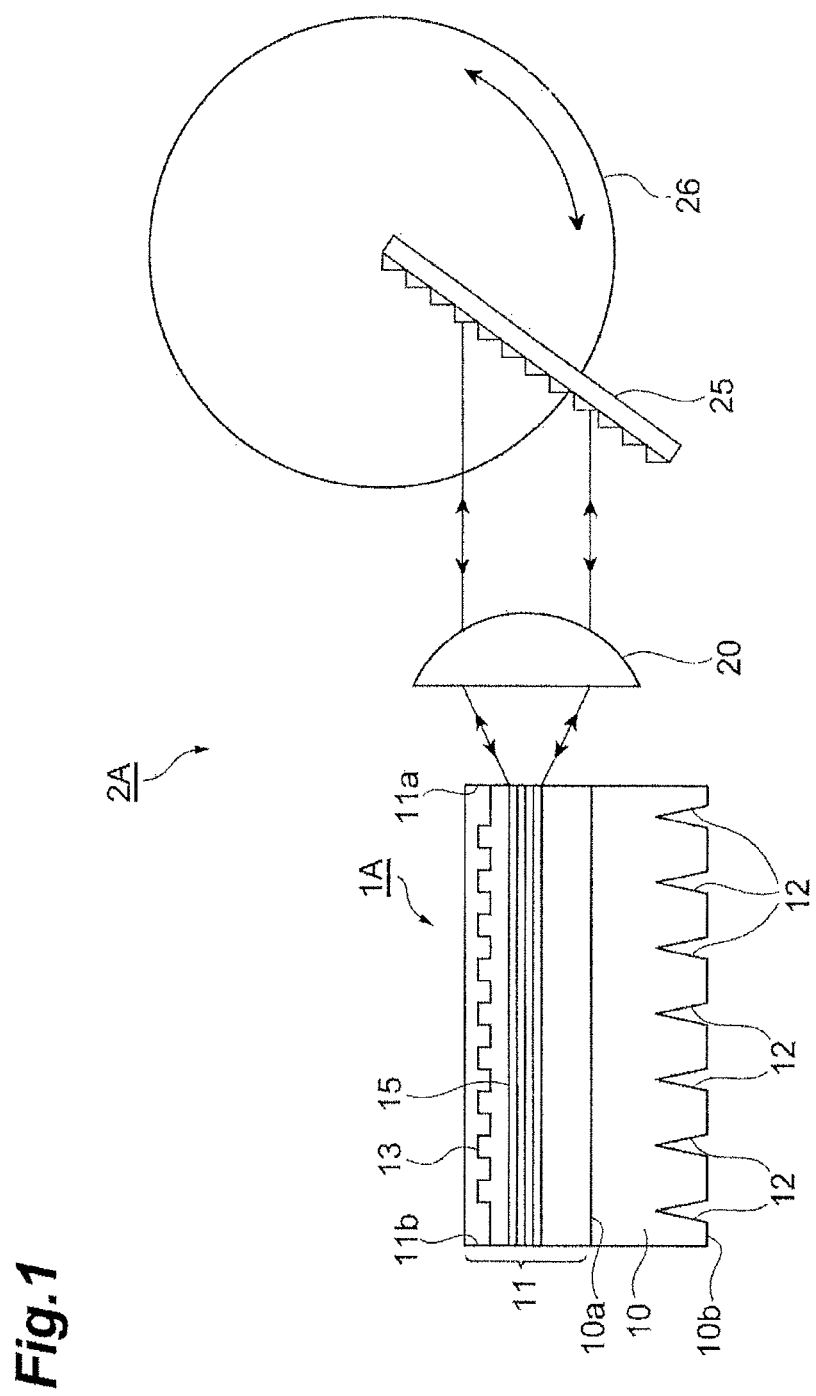
FIG. 1 is a diagram schematically showing a basic configuration of a quantum cascade laser.

Hereinafter, an embodiment of a quantum cascade laser according to the present invention will be described in detail with reference to the drawings. In the description of the drawings, the same elements will be denoted by the same reference signs, without redundant description. The dimensional ratios in the drawings are not always coincident with those in the description.

Figure 2:
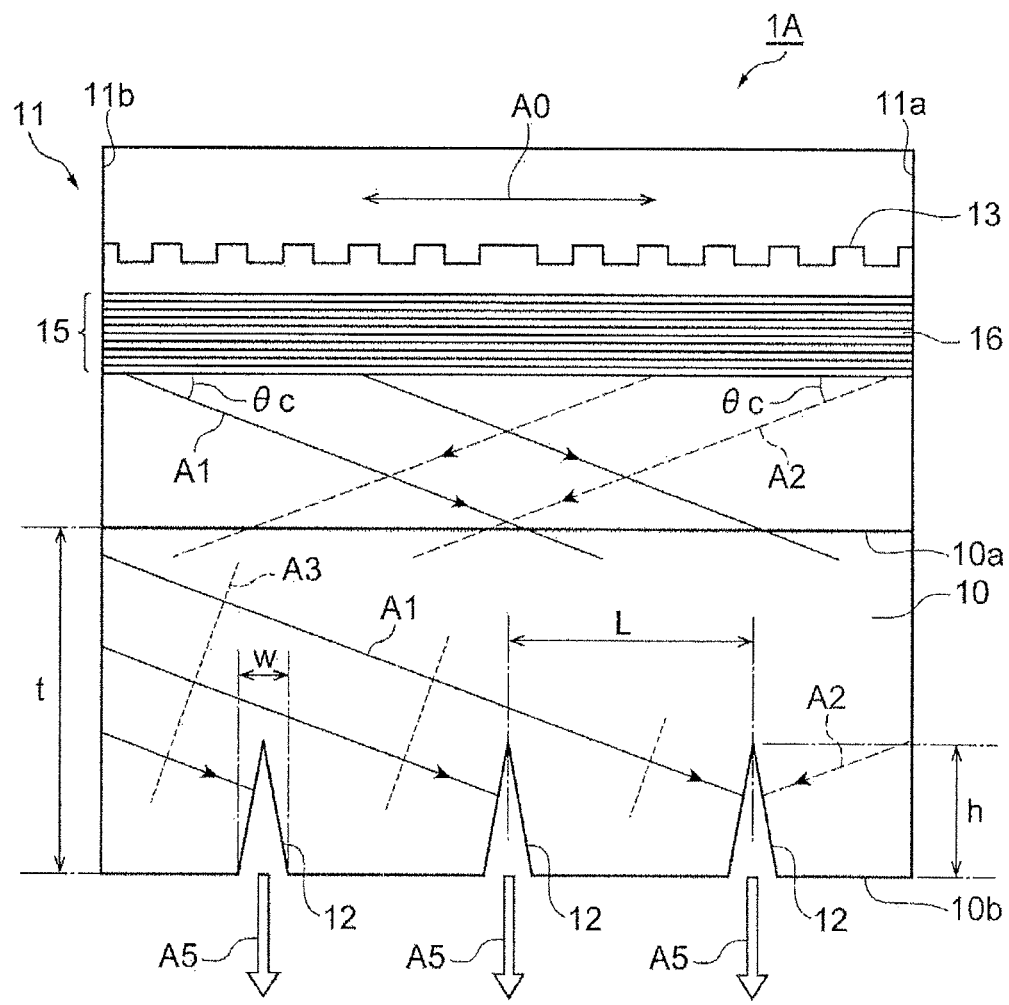
FIG. 2 is a side view showing a configuration of a laser element main body in the quantum cascade laser, and generation of output light by difference frequency generation.

FIG. 1 is a diagram schematically showing a basic configuration of a quantum cascade laser. FIG. 2 is a side view showing a configuration of a laser element main body in the quantum cascade laser shown in FIG. 1, and generation of output light by difference frequency generation. A quantum cascade laser 2A of the present embodiment is a monopolar type laser element that generates light by using transitions of electrons between subbands in a semiconductor quantum well structure. The quantum cascade laser 2A includes a laser element main body 1A, a collimating lens 20, and an external diffraction grating 25. In addition, the laser element main body 1A includes a semiconductor substrate 10, and an element structure portion 11 including an active layer 15 formed on a first surface (front surface) 10a of the semiconductor substrate 10.

The active layer 15 has a cascade structure in which quantum well emission layers to be used for generation of light and electron injection layers to be used for injection of electrons into the emission layers are stacked alternately in multiple stages. Specifically, as shown in FIG. 2, when a unit laminate structure 16 of one period is defined as a semiconductor laminate structure consisting of a quantum well emission layer and an injection layer, the active layer 15 having the cascade structure is configured by stacking the unit laminate structure 16 in multiple stages. The number of unit laminate structures 16 stacked including the emission layer and the injection layer is set appropriately according to the specific configuration, characteristics, and the like of the laser element. The active layer 15 is formed on the semiconductor substrate 10 directly, or via another semiconductor layer.

In the laser element main body 1A in the quantum cascade laser 2A of the present embodiment, the active layer 15 is configured to be capable of generating first pump light of a first frequency $\omega_1$ and second pump light of a second frequency $\omega_2$ by intersubband emission transitions of electrons, and to generate the output light of difference frequency $\omega = |\omega_1 - \omega_2|$ between the first frequency $\omega_1$ and the second frequency $\omega_2$ by difference frequency generation (DFG) from the first pump light and the second pump light. Here, the frequencies $\omega_1$, $\omega_2$ of pump light components are determined by a subband level structure in the active layer 15, and by an internal diffraction grating 13, the external diffraction grating 25 for frequency (wavelength) selection described later.

In this configuration, each of the first pump light, second pump light of the frequencies $\omega_1$, $\omega_2$ to be generated in the active layer 15 is, for example, mid-infrared light. The light of the frequency $\omega$ to be generated by the difference frequency generation is, for example, long-wavelength light such as the terahertz light. In FIG. 2, a resonating direction (travelling direction of pump light) of the first pump light and the second pump light in a laser cavity structure is shown by an arrow A0. The resonating direction A0 is substantially parallel to the first surface 10a of the substrate 10 on which the element structure portion 11 being the semiconductor laminate structure including the active layer 15 is formed.

Figure 3:
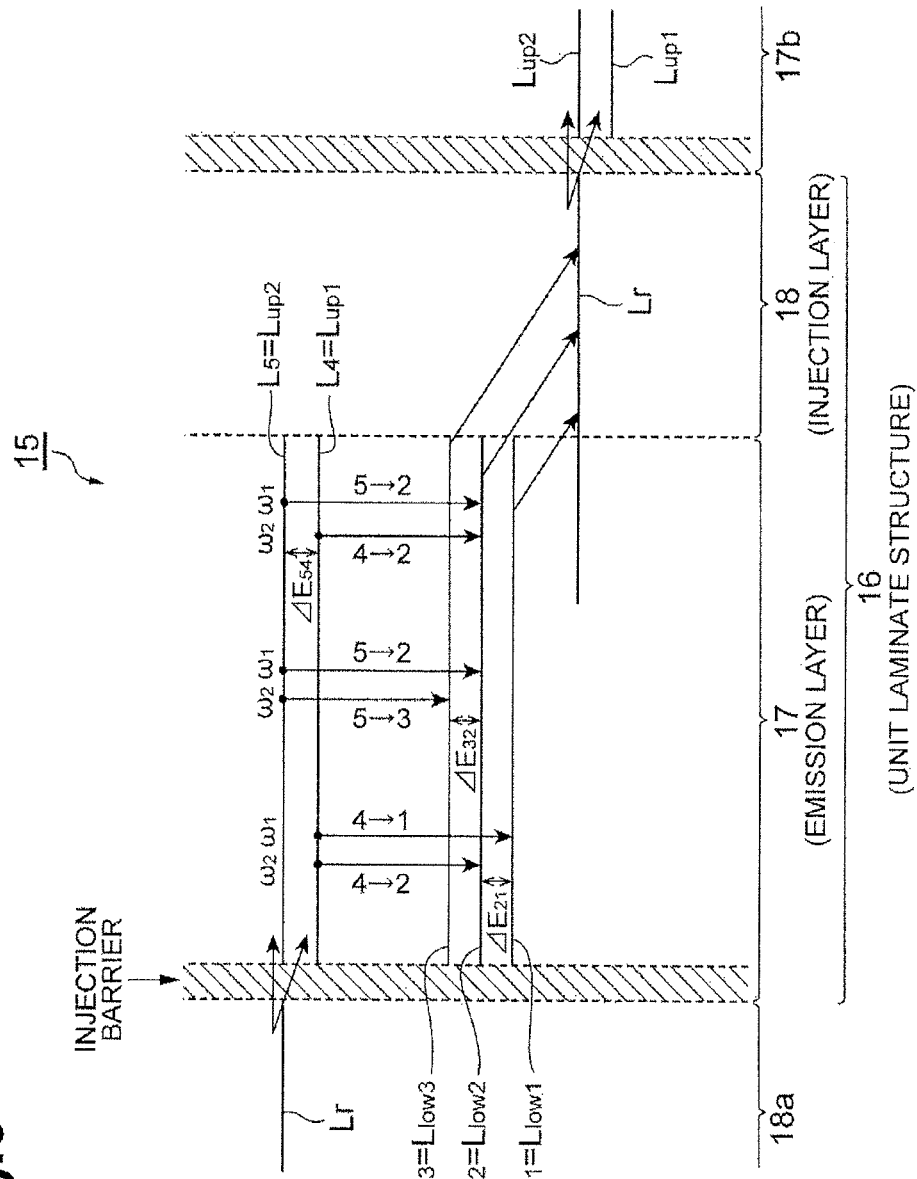
FIG. 3 is a diagram showing an example of a configuration of an active layer of the quantum cascade laser, and a subband level structure in the active layer.

FIG. 3 is a diagram showing an example of a configuration of the active layer 15 of the quantum cascade laser 2A shown in FIG. 1, FIG. 2, and a subband level structure in the active layer 15. The active layer 15 in the present embodiment has a DAU/MS (dual-upper-state to multiple lower state) structure (cf. Patent Document 4: Japanese Patent Application Laid-Open Publication No. 2011-035139, Patent Document 5: Japanese Patent Application Laid-Open Publication No. 2011-243781, Patent Document 6: Japanese Patent Application Laid-Open Publication No. 2013-098251), and is configured to be capable of generating light of the first frequency $\omega_1$ and light of the second frequency $\omega_2$. The active layer 15 is configured with a single type of active layer structure.

As shown in FIG. 3, each of the plurality of unit laminate structures 16 included in the active layer 15 is configured with a quantum well emission layer 17 and an electron injection layer 18. Each of these emission layer 17 and injection layer 18 is formed with a predetermined quantum well structure including quantum well layers and quantum barrier layers. In this configuration, the subband level structure, which is an energy level structure based on the quantum well structure, is formed in the unit laminate structure 16.

The unit laminate structure 16 in the present embodiment, in its subband level structure, has a first emission upper level (level 4) $L_{up1}=L_4$, a second emission upper level (level 5) $L_{up2}=L_5$ having a higher energy than the first emission upper level, and a plurality of emission lower levels. In the configuration example shown in FIG. 3, a relaxation level $L_r$ is provided as a level having a lower energy than the emission lower levels.

The unit laminate structure 16, more specifically in the above subband level structure, has a first emission lower level (level 1) $L_{low1}=L_1$, a second emission lower level (level 2) $L_{low2}=L_2$ having a higher energy than the first emission lower level, and a third emission lower level (level 3) $L_{low3}=L_3$ having a higher energy than the second emission lower level, as the plurality of emission lower levels each having a lower energy than the first emission upper level.

In the unit laminate structure 16 shown in FIG. 3, between the emission layer 17 and an injection layer 18a in the unit laminate structure of the preceding stage, an injection barrier layer for electrons to be injected from the injection layer 18a into the emission layer 17 is provided. An exit barrier layer for electrons from the emission layer 17 to the injection layer 18 is provided as needed between the emission layer 17 and the injection layer 18. However, FIG. 3 shows the configuration example in which only a barrier layer thin enough for the wave function to sufficiently exude is provided between the emission layer 17 and the injection layer 18.

A specific interval configuration of the levels in the subband level structure in the unit laminate structure 16 is as follows: each of an energy $\Delta E_{41}$ of an emission transition (4→1) from the first emission upper level $L_{up1}$ to the first emission lower level $L_{low1}$ and an energy $\Delta E_{52}$ of an emission transition (5→2) from the second emission upper level $L_{up2}$ to the second emission lower level $L_{low2}$ is substantially equal to an energy $E_1$ of the light of the first frequency $\omega_1$ ($\Delta E_{41}=\Delta E_{52}=E_1$). Furthermore, each of an energy $\Delta E_{42}$ of an emission transition (4→2) from the first emission upper level $L_{up1}$ to the second emission lower level $L_{low2}$ and an energy $\Delta E_{53}$ of an emission transition (5→3) from the second emission upper level $L_{up2}$ to the third emission lower level $L_{low3}$ is substantially equal to an energy $E_2$ of the light of the second frequency $\omega_2$ ($\Delta E_{42}=\Delta E_{53}=E_2$). In the present configuration example, the first, second frequencies $\omega_1$, $\omega_2$ are set so as to satisfy the condition $\omega_1 > \omega_2$, and the difference frequency is $\omega = \omega_1 - \omega_2$.

In the above level structure, each of an energy difference $\Delta E_{21}$ between the first emission lower level $L_{low1}$ and the second emission lower level $L_{low2}$, an energy difference $\Delta E_{32}$ between the second emission lower level $L_{low2}$ and the third emission lower level $L_{low3}$, and an energy difference $\Delta E_{34}$ between the first emission upper level $L_{up1}$ and the second emission upper level $L_{up2}$ is substantially equal to an energy $E=E_1-E_2$ of the light of the difference frequency $\omega$ between the first, second frequencies $\omega_1$, $\omega_2$ ($\Delta E_{21}=\Delta E_{32}=\Delta E_{54}=E$).

In this subband level structure, electrons from the relaxation level $L_r$ in the injection layer 18a of the preceding stage are injected through the injection barrier into the emission layer 17, to strongly excite the second emission upper level $L_{up2}$ coupled to the relaxation level $L_r$. At this time, a sufficient amount of electrons are also supplied to the first emission upper level $L_{up1}$ through a high-speed scattering process such as electron-electron scattering, with the result that sufficient amounts of carriers are supplied to both of the two emission upper levels $L_{up1}$, $L_{up2}$.

The electrons injected into the first, second emission upper levels $L_{up1}$, $L_{up2}$ transit to each of first, second, third emission lower levels $L_{low1}$, $L_{low2}$, $L_{low3}$, so as to generate and emit light with energies corresponding to the energy differences between the subband levels of the emission upper levels and the lower levels; particularly, it results in generating and emitting the first pump light of the first frequency $\omega_1$ with the energy $E_1$ and the second pump light of the second frequency $\omega_2$ with the energy $E_2$.

The electrons having transited to the emission lower levels $L_{low1}$, $L_{low2}$, $L_{low3}$ are relaxed to the relaxation level $L_r$. As the electrons are extracted from the emission lower levels $L_{low1}$, $L_{low2}$, $L_{low3}$ in this manner, population inversion is formed to achieve lasing between the upper levels $L_{up1}$, $L_{up2}$ and the lower levels $L_{low1}$, $L_{low2}$, $L_{low3}$. Here, the relaxation level $L_r$ used for relaxation of electrons is schematically represented by only one level in FIG. 3, but the relaxation level may be configured by a plurality of levels, or a miniband. The electrons relaxed from the emission lower levels to the relaxation level $L_r$ are injected in a cascade manner from the relaxation level $L_r$ through the injection layer 18 into the emission upper levels $L_{upp}$, $L_{up2}$ in an emission layer 17b of the subsequent stage.

As the injection, emission transitions, and relaxation of electrons described above are repeated in the plurality of unit laminate structures 16 constituting the active layer 15, light generation occurs in a cascade manner in the active layer 15. Namely, the emission layer 17 and the injection layer 18 are stacked alternately in a large number of stages, whereby electrons move in a cascade manner in the laminate structures 16 while generating the first pump light of the first frequency $\omega_1$ and the second pump light of the second frequency $\omega_2$ during the intersubband emission transitions in each laminate structure 16. By the difference frequency generation by these first pump light and second pump light, the light of the difference frequency $\omega$ such as the terahertz light is generated and output.

The configuration of the active layer 15 will be further described later along with a specific example thereof. Regarding the active layer 15, various configurations may be used having the first, second emission upper levels and the plurality of emission lower levels and capable of generating the first pump light of the first frequency $\omega_1$ and the second pump light of the second frequency $\omega_2$, besides the configuration shown in FIG. 3.

Referring again to FIG. 1, FIG. 2. In the quantum cascade laser 2A of the present embodiment, as shown in FIG. 1, the external diffraction grating 25 is provided for feeding the light of the first frequency $\omega_1$ back to the element structure portion 11, outside the element structure portion 11 including the active layer 15 provided on the first surface 10a of the semiconductor substrate 10. The external diffraction grating 25, specifically, is arranged at a position facing a first end face 11a in the laser cavity structure of the element structure portion 11 of the element main body 1A via the collimating lens 20. Thus, an external cavity (EC) for generating the first pump light of the first frequency $\omega_1$ is configured with a second end face 11b opposite to the external diffraction grating 25 of the element structure portion 11 and the external diffraction grating 25.

In the present configuration example, a rotation stage 26 is provided functioning as a resonance frequency variation mechanism (resonance wavelength variation mechanism) by changing an installation angle to the optical axis by rotationally driving the diffraction grating 25, for the external diffraction grating 25. Thus, the external cavity using the external diffraction grating 25 is configured to be capable of changing the first frequency $\omega_1$ of the first pump light.

In the quantum cascade laser 2A, as schematically shown in FIG. 1, FIG. 2, the internal diffraction grating 13 is provided constituting a distributed feedback (DFB) cavity for generating the second pump light of the second frequency $\omega_2$, inside the element structure portion 11 including the active layer 15. With the above configuration, in the quantum cascade laser 2A of the present embodiment, the frequency $\omega_1$ of the first pump light and the frequency $\omega_2$ of the second pump light are determined by the configuration of the external diffraction grating 25 of the external cavity and the internal diffraction grating 13 of the distributed feedback cavity. In addition, the resonance frequency $\omega_1$ by the external diffraction grating 25 is configured to be variable with the rotation stage 26, so that frequency $\omega$ of the output light generated by the difference frequency generation is made to be variable.

In this configuration, the second frequency $\omega_2$ determined by the internal diffraction grating 13 is set to be fixed to a frequency not coincident with a gain peak in a gain spectrum of the active layer 15. The first frequency $\omega_1$ determined by the external diffraction grating 25 is set to be variable to a frequency different from the above second frequency $\omega_2$. The second frequency $\omega_2$ set to the frequency different from the gain peak may be set to any of a lower frequency (long wavelength) side and a higher frequency (short wavelength) side with respect to the peak frequency.

The frequencies $\omega_1$, $\omega_2$ of the pump light components of two wavelengths resonated and generated in the laser cavity structure in the quantum cascade laser 2A may be substantially equal to the frequencies $\omega_1$, $\omega_2$ described above in regard to the energies between levels in the level structure shown in FIG. 3, or need not be equal to the frequencies. Here, in a coupled dual upper level structure (DAU structure) shown in FIG. 3, for example, a unimodal wide band emission spectrum (corresponding to gain spectrum) is obtained, as described later. The frequencies $\omega_1$, $\omega_2$ of the pump light can be set as described above, considering the peak frequency, for such a gain spectrum. In the level structure of FIG. 3, the frequencies $\omega_1$, $\omega_2$ are set so that $\omega_1 > \omega_2$; however, the frequencies may be set so that $\omega_1 < \omega_2$.

The configuration of the quantum cascade laser 2A including the element main body 1A shown in FIG. 1, FIG. 2 will be further described. In the following description, an example will be mainly described in which each of the first pump light of the first frequency $\omega_1$ and the second pump light of the second frequency $\omega_2$ is mid-infrared light, the output light of the difference frequency $\omega$ is terahertz light, and InP is used as a semiconductor material of the semiconductor substrate 10. Here, the refractive index of the InP substrate in the terahertz band is $n_{THz}=3.6$ for the terahertz light of the frequency of 3 THz. The effective refractive index for the mid-infrared light to be used for the pump light is $n_{MIR}=3.37$. However, the configuration of the quantum cascade laser 2A of the present embodiment is not limited to this configuration.

The quantum cascade laser 2A of the present embodiment uses Cerenkov phase matching in generation and output of the light of the difference frequency $\omega$ by the difference frequency generation. The Cerenkov phase matching is a pseudo phase matching method, and the terahertz output light is emitted in a direction having a finite emission angle $\theta c$ with respect to a travelling direction A0 of the mid-infrared pump light, as shown in FIG. 2 by a solid arrow A1 toward the lower right direction and a dashed arrow A2 toward the lower left direction. In FIG. 2, a dotted line A3 shown with the radiation direction A1 shows the wave front of the terahertz light.

Cerenkov radiation is generated, when pump light components of two wavelengths whose difference frequency $\omega$ corresponds to the terahertz wave enter the nonlinear optical crystal, by induction of second-order nonlinear polarization having spatial distribution according to a phase difference between the components of the two wavelengths. The nonlinear polarization has a frequency to be a difference frequency between the pump light components of two wavelengths, and radiates the terahertz light at timing according to the phase of the nonlinear polarization at each point.

As a result, when the refractive index of the InP substrate in the terahertz band $n_{THz}=3.6$ is greater than the effective refractive index in the mid-infrared region $n_{MIR}=3.37$, due to refractive index dispersion, the terahertz light generated in the crystal propagates in the same phase in the radiation directions A1, A2 shown in FIG. 2. A Cerenkov emission angle $\theta c$ at this time with the frequency of 3 THz is represented by the formula below.

$$\theta c = \cos^{-1}(n_{MIR}/n_{THz}) \sim 20°$$

Namely, in the DFG-THz-QCL in which the semiconductor laminate structure including the active layer 15 is grown on the InP substrate 10, the terahertz light generated by the difference frequency generation propagates downward from the active layer 15 at the emission angle of about 20°, as shown in FIG. 2.

The terahertz light generated in the active layer 15 to be emitted by Cerenkov radiation propagates the inside of the InP substrate 10 in the direction of the above-described emission angle θc, and finally reaches a second surface (rear surface) 10b being an interface between the substrate 10 and the air outside the element and opposite to the first surface 10a of the substrate 10. At this time, the refractive index of the air $n_{air}=1$ is significantly different from the refractive index of the InP substrate 10 for the terahertz light $n_{THz}=3.6$. For this reason, total reflection occurs on the second surface 10b, and it is difficult to extract the terahertz light as the output light to the outside of the element.

On the other hand, in the quantum cascade laser 2A including the laser element main body 1A shown in FIG. 2, a plurality of grooves 12, respectively formed in a direction intersecting with the resonating direction A0 in the laser cavity structure, are provided on the second surface 10b of the semiconductor substrate 10. In this configuration, the terahertz output light is output below the substrate of the outside from each of the plurality of grooves 12, as schematically shown by an arrow A5 in FIG. 2.

Effects of the quantum cascade laser 2A having the laser element main body 1A of the present embodiment will be described.

In the quantum cascade laser 2A shown in FIG. 1, FIG. 2, the active layer 15 is configured to be capable of generating the light components of two frequencies of the first pump light of the first frequency $\omega_1$ and the second pump light of the second frequency $\omega_2$, as the configuration example of the active layer 15 shown in FIG. 3. In this configuration, by using the difference frequency generation by the first pump light and the second pump light, long-wavelength output light such as the terahertz light can be generated as light of the difference frequency $\omega$.

The external diffraction grating 25 is provided constituting the external cavity for generating the first pump light, outside the element structure portion 11 provided on the first surface 10a of the semiconductor substrate 10 including the active layer 15, and the internal diffraction grating 13 is provided constituting the distributed feedback cavity for generating the second pump light, inside the element structure portion 11, and the external diffraction grating 25 is configured to be capable of changing the first frequency $\omega_1$ of light resonating in the external cavity.

In this way, according to the configuration in which the external diffraction grating 25 and the internal diffraction grating 13 are provided for the active layer 15, the first, second frequencies $\omega_1$, $\omega_2$ of the pump light components are suitably set and controlled by the external cavity with the external diffraction grating 25 and the distributed feedback cavity with the internal diffraction grating 13, and the first pump light and the second pump light to be used for the difference frequency generation can be suitably generated. In this configuration, by changing the frequency $\omega_1$ of the first pump light by the external diffraction grating 25, the frequency $\omega$ of the output light such as the terahertz light generated by the difference frequency generation can be continuously and variably controlled.

In the quantum cascade laser 2A, the active layer 15 is configured with a single type of active layer structure, and specifically, as shown in FIG. 3, two emission upper levels of the first, second emission upper levels and the plurality of (two or more, three in FIG. 3) emission lower levels are provided in the subband level structure in the unit laminate structure 16 configured with the emission layer 17 and the injection layer 18. In this way, according to the configuration in which two emission upper levels and two or more emission lower levels are combined, a unimodal and wide band emission spectrum (gain spectrum of emission) can be obtained with the single active layer structure, by appropriately setting energy intervals between the levels and the like. Thus, in the active layer 15, the first pump light and the second pump light having different frequencies from each other can be suitably generated.

Further, for the active layer 15 having such a level structure, the second frequency $\omega_2$ in the distributed feedback cavity with the internal diffraction grating 13 is set to be fixed to the frequency different from the gain peak, and the first frequency $\omega_1$ in the external cavity with the external diffraction grating 25 is set to be variable to the frequency different from the second frequency $\omega_2$. According to the quantum cascade laser 2A having this configuration, generation of the first pump light, the second pump light, and generation of the output light such as the terahertz light by the difference frequency generation can be suitably achieved.

Here, in the above configuration, the frequency $\omega_2$ of the second pump light, determined by the internal diffraction grating 13 of the distributed feedback cavity, is preferably set to a frequency at which the intensity at the frequency $\omega_2$ in the gain spectrum is 60% or more and 90% or less compared to the gain peak. According to this configuration, it is possible to appropriately set the first, second frequencies $\omega_1$, $\omega_2$ that are determined by the external diffraction grating 25 and the internal diffraction grating 13, and to suitably generate the first pump light and the second pump light.

The above configuration is preferably configured to be provided with the plurality of grooves 12 respectively formed in the direction intersecting with the resonating direction in the laser cavity structure on the second surface 10b opposite to the first surface 10a of the semiconductor substrate 10. According to this configuration, the light can be suitably output to the outside such as the terahertz light generated by the difference frequency generation in the active layer 15, by making each of side surfaces of the plurality of grooves 12 provided on the substrate rear surface 10b function as an output surface of the output light.

In this configuration using the plurality of grooves 12 of the substrate rear surface 10b for light output to the outside, change of the output angle (output angle distribution) of the light to the outside can be suppressed, even when the difference frequency $\omega$ of the output light is made to be variable by the external cavity as described above. In this configuration, since the substrate rear surface 10b is the output surface of the light, an optical system such as a lens, an optical fiber can be easily attached as needed.

When the grooves 12 are formed on the substrate rear surface 10b, regarding the shape, each of the plurality of grooves 12 is preferably configured to be formed in a curved surface shape in which a width in the groove monotonically decreases from the second surface 10b side in a depth direction, and an inclination angle θg of a side surface with respect to a direction (semiconductor lamination direction in laser element) perpendicular to the second surface 10b varies. According to this configuration, the output angle of the light is changed depending on a position in the groove side surface, so that change of the output angle distribution due to change of the frequency $\omega$ of the output light can be suitably suppressed.

In the above configuration, regarding the formation direction of the grooves 12 on the second surface 10b of the semiconductor substrate 10, the grooves 12 are preferably respectively formed in a direction perpendicular to the resonating direction A0 of the light on the second surface 10b. In this configuration, each of the side surfaces of the plurality of grooves 12 can be made to suitably function as the output surface of the output light such as the terahertz light.

Regarding the specific configuration of the semiconductor substrate 10 in the laser element main body 1A, the plurality of grooves 12 of the second surface 10b, and the like, the semiconductor substrate 10 is preferably configured so that the thickness t is 50 μm or more and 200 μm or less. Each of the plurality of grooves 12 is preferably configured to be formed so that the width w is h/10 or more and 2 h or less (1/10 or more and 2 times or less of depth h), where h is the depth of the grooves.

Each of the plurality of grooves 12 is preferably configured to be formed so that the depth h is 30 μm or more and t−20 μm or less, where t is the thickness of the semiconductor substrate 10. Each of the plurality of grooves 12 is preferably configured to be formed so that the depth h is λ/10 or more and 2λ or less (1/10 or more and 2 times or less of wavelength λ of output light), where λ is the wavelength of the output light.

The plurality of grooves 12 are preferably formed so that the interval L of the grooves is h/2 or more and 2h/tan θc+w or less, where h is the depth of the grooves, w is the width of the grooves, and θc is the emission angle of the output light by the difference frequency generation. Furthermore, the plurality of grooves 12 are preferably formed so that the interval L of the grooves is h/tan θc+w/2 or more, where h is the depth of the grooves, w is the width of the grooves, and θc is the emission angle of the output light by the difference frequency generation.

Each of the plurality of grooves 12 is preferably configured to be formed so that the inclination angle θg of the side surface with respect to the direction (semiconductor lamination direction in laser element) perpendicular to the second surface 10b is 4° or more and 20° or less.

According to these configurations, the output light such as the terahertz light can be suitably output with sufficient intensity from each of side surfaces and inner surfaces of the grooves 12 formed on the second surface 10b of the semiconductor substrate 10.

Here, in the quantum cascade laser, as a configuration of the active layer of when the terahertz light is generated by the difference frequency generation, a configuration is considered in which a plurality of types of active layer structures are stacked having different quantum well structures from each other. However, in this configuration, the entire configuration of the active layer is complicated, and problems may occur such as destabilization of operation of the active layer, and rise of the threshold, increase in power consumption, and deterioration of element characteristics caused by heat due to the destabilization. In addition, in this configuration having the plurality of active layer structures, design of the quantum level structure is difficult, and, since the active layers have different nonlinear optical characteristics respectively, it is not efficient in wavelength conversion efficiency by the difference frequency generation.

On the other hand, the quantum cascade laser 2A of the above configuration has a configuration in which the active layer 15 is configured with a single type of active layer structure, and the first, second emission upper levels, and the plurality of emission lower levels are provided in its subband level structure. According to this configuration, by using the active layer 15 in the single active layer design for a gain medium, the output light such as the terahertz light can be generated at high efficiency by the difference frequency generation. In addition, the entire configuration of the active layer can be simplified and stabilization of the operation, improvement of the element characteristics, and the like can be achieved.

Figure 4:
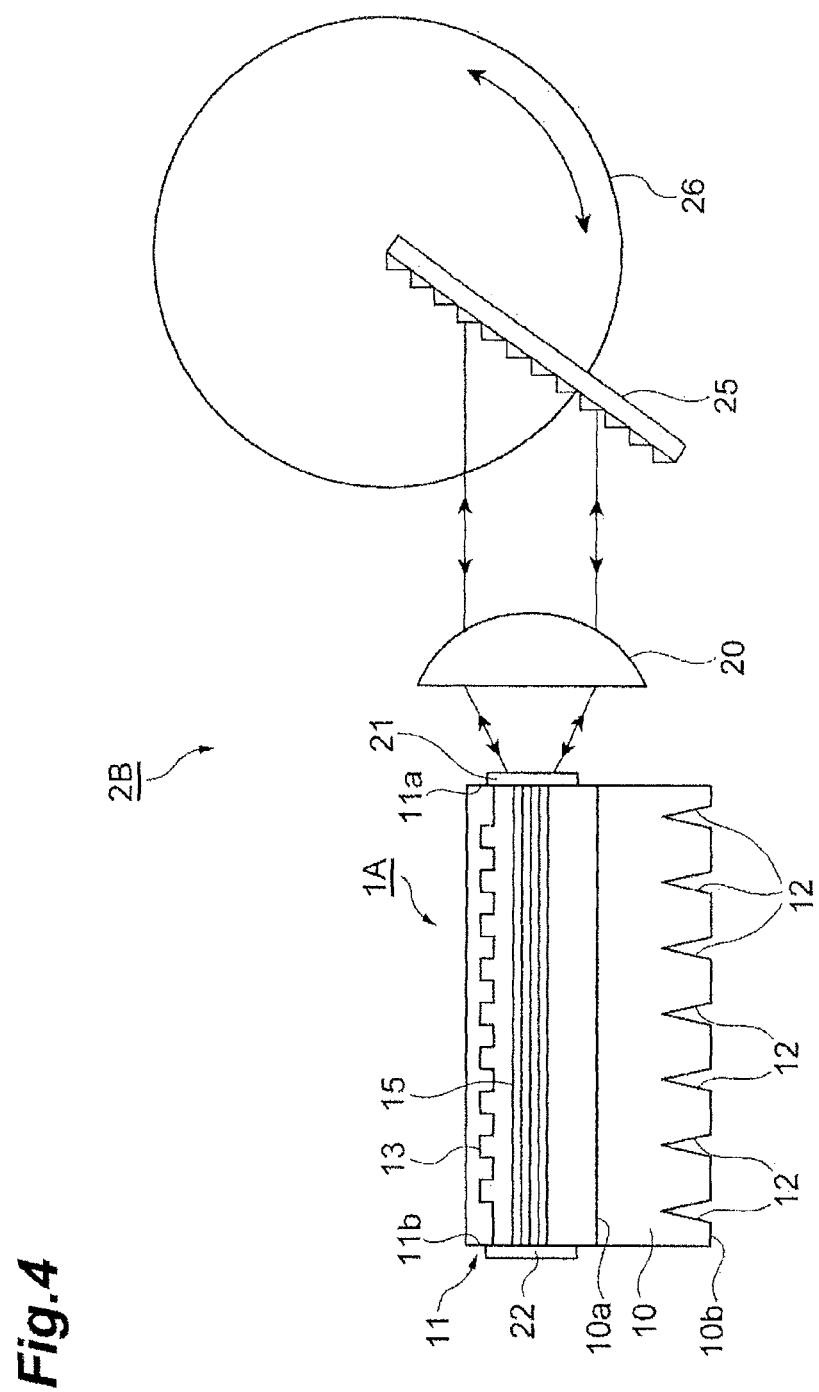
FIG. 4 is a diagram showing a configuration of a modification example of the quantum cascade laser.

FIG. 4 is a diagram showing a configuration of a modification example of the quantum cascade laser shown in FIG. 1. In a quantum cascade laser 2B of the present configuration example, in addition to the configuration of the quantum cascade laser 2A shown in FIG. 1, a reflection reducing film (low reflection film) 21 is formed for reducing reflectance for the light of the frequency of the gain peak, on the first end face 11a of the external diffraction grating 25 side of the element structure portion 11. A reflection film (high reflection film) 22 is formed for increasing the reflectance for the light of the frequency of the gain peak, on the second end face 11b opposite to the external diffraction grating 25 of the element structure portion 11.

In this way, the reflection reducing film 21, reflection film 22 are respectively provided on the first end face 11a, second end face 11b of the element structure portion 11 in the laser element main body 1A, so that the laser cavity structure can be suitably configured using the external diffraction grating 25 and the internal diffraction grating 13 in the quantum cascade laser 2B. Here, it may be configured so that only one of the reflection reducing film 21 and the reflection film 22 is provided. The configurations of the reflection reducing film 21, reflection film 22 will be further described later specifically.

Figure 5:
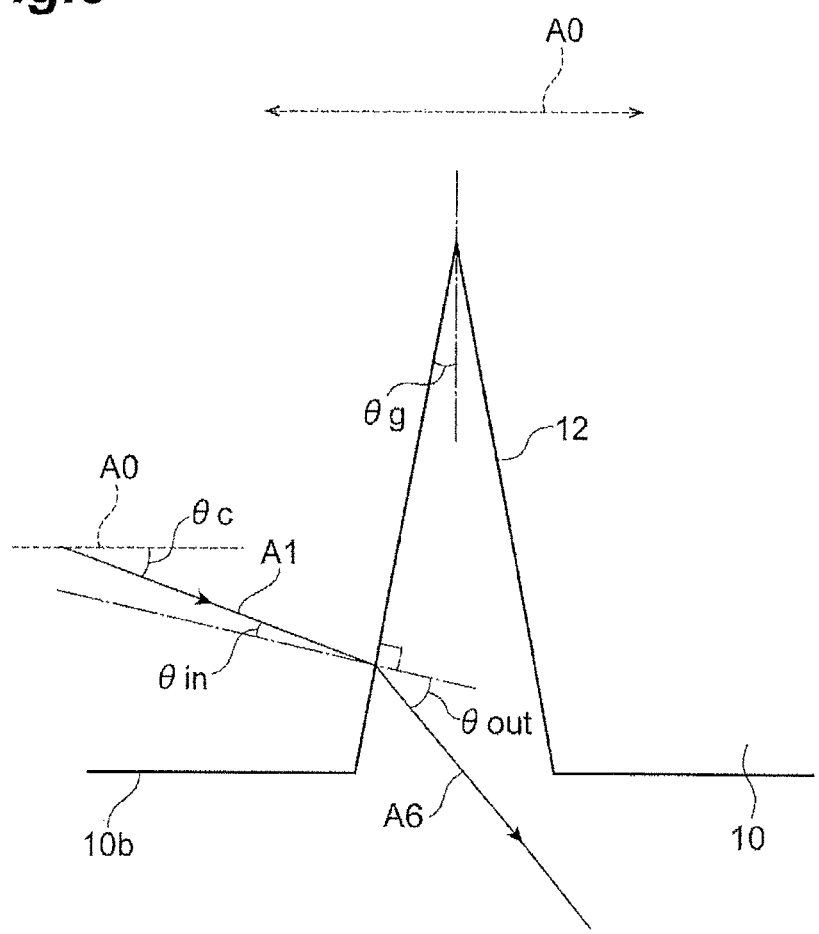
FIG. 5 is a side view showing a configuration of a groove formed on a second surface of a semiconductor substrate.
Figure 6:
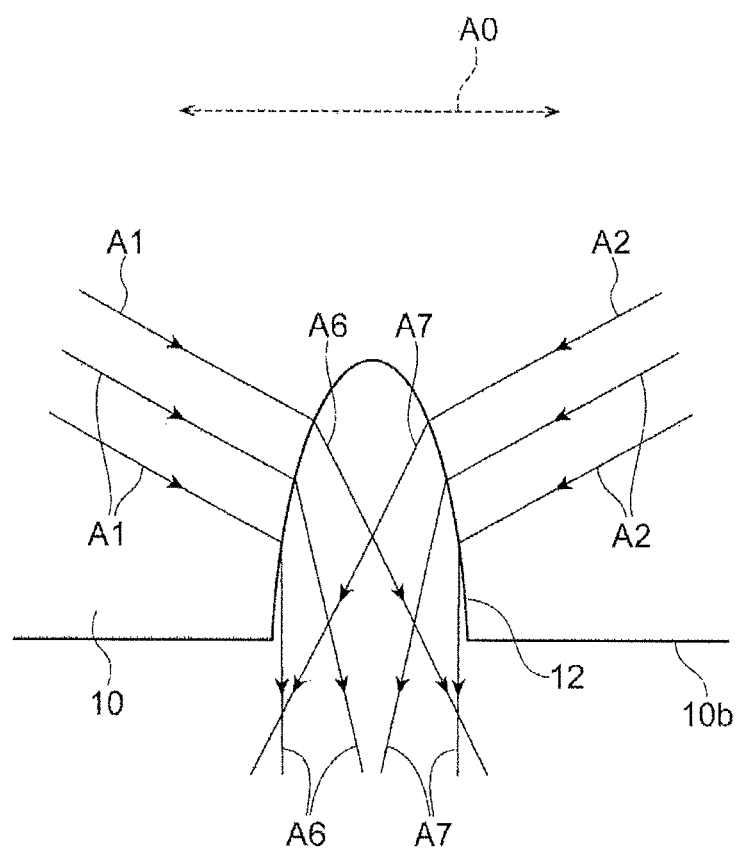
FIG. 6 is a side view showing a configuration of a groove formed on the second surface of the semiconductor substrate.

The output condition of the terahertz light in the plurality of grooves 12 in the quantum cascade laser 2A having the element main body 1A shown in FIG. 1, FIG. 2 will be further described. FIG. 5, FIG. 6 are side views each showing a configuration of the groove 12 formed on the second surface 10b of the semiconductor substrate 10.

Here, as one of problems in improvement in characteristics of the THz-QCL, there is reabsorption inside the substrate of the terahertz light generated in the active layer. Even when an InP substrate not doped with impurities is used as a substrate of the quantum cascade laser, for example, an absorption coefficient for the light of the frequency of 3 THz is about 20 cm$^{-1}$. At this time, the coherence length is about 100 μm; therefore, most of the terahertz light generated in the active layer is absorbed inside the substrate without being extracted to the outside. The plurality of grooves 12 provided on the substrate rear surface 10b in the above embodiment is the one for suitably outputting such light.

In the quantum cascade laser 2A of the above embodiment, as shown in FIG. 5, the plurality of grooves 12 are formed on the second surface 10b of the substrate 10. The terahertz light emitted by Cerenkov radiation in the radiation direction A1 at the emission angle θc is refracted on the interface between the semiconductor and the air on the side surface of the groove 12, to be extracted to the outside as the output light in an output direction A6.

Here, as described above, a case is considered as an example in which the semiconductor substrate 10 is a semi-insulating InP substrate, the emission angle of the terahertz light from the active layer 15 to the downward direction is θc=20° assuming frequency of 3 THz, and the inclination angle of the side surface of the groove 12 with respect to the direction perpendicular to the second surface 10b is θg=10°. In this configuration, the terahertz light propagating inside the substrate 10 enters at an incident angle $\theta_{in}$=10° to the side surface of the groove 12.

At this time, the refractive index of the air is $n_{air}$=1 in contrast with the refractive index of the InP substrate 10 in the terahertz band $n_{THz}$=3.6, and based on the Snell's law $n_1 \sin \theta_1 = n_2 \sin \theta_2$, the terahertz light is output refracted at an exit angle $\theta_{out}=40°$ from the side surface of the groove 12 to the downward direction. In this configuration, as a result, the terahertz light can be output in a surface direction of the semiconductor substrate 10 through the plurality of grooves 12.

Here, when the inclination angle of the side surface of the groove 12 is $\theta g=0°$ and the groove side surface is parallel to a cleaved end face, the terahertz light is totally reflected and is not output to the outside. When the terahertz light propagates inside the substrate 10 at the emission angle $\theta c=20°$, the terahertz light is output in the surface direction of the substrate 10 without being totally reflected, at the inclination angle $\theta g$ of the groove side surface of 4° or more. On the other hand, when the inclination angle $\theta g$ of the groove side surface is greater than 20°, the terahertz light is refracted upward, so that components to be taken in again to the substrate 10 are generated. Therefore, regarding the side surface of the groove 12, the groove 12 is preferably formed so that its inclination angle $\theta g$ is, for example, 4° or more and 20° or less.

The groove 12 actually formed on the second surface 10b of the semiconductor substrate 10 does not have the a pointed shape with the planar side surface as shown in FIG. 5, but has the side surface of a curved shape and has the shape whose inclination angle continuously varies inside the groove as shown in FIG. 6. In this case, as shown in FIG. 6 by propagating directions A1, A2 inside the substrate 10 of the terahertz light and output directions A6, A7 from the groove side surface by solid arrows, the refraction angle of the terahertz light and the exit angle to the outside vary, depending on positions at the groove side surface.

In consideration of this point, regarding the inclination angle $\theta g$ of the side surface of the groove 12, the groove 12 is preferably formed such that the inclination angle $\theta g$ satisfies the condition of 4° or more and 20° or less in as many portions as possible of the groove side surface, for example, the surface portions of ⅓ or more of the groove side surface. The depth h, width w, and interval L of the grooves 12, and the thickness t of the semiconductor substrate 10 are preferably set appropriately considering the output condition of the light to the outside.

In the quantum cascade laser 2A shown in FIG. 1, FIG. 2, the resonance frequency $\omega_1$ in the external cavity using the external diffraction grating 25 is configured to be variable, so that the frequency $\omega$ of the terahertz light is made to be variable. For this situation, according to the configuration of outputting the terahertz light from the plurality of grooves 12 formed on the second surface 10b of the substrate 10, change of the output condition such as the output angle distribution of the light to the outside can be suppressed even when the frequency $\omega$ of the output light is made to be variable.

The groove structure of the plurality of grooves 12 on the second surface 10b of the semiconductor substrate 10 described above can be processed and formed by, for example, a dicing saw, a scriber, or, in a case of relatively shallow grooves, etching processing, and focused ion beam. When the grooves are formed by using the dicing saw, the scriber, or the like, the groove side surface can be a suitable curved surface shape by applying wet etching after groove processing.

Figure 7A:
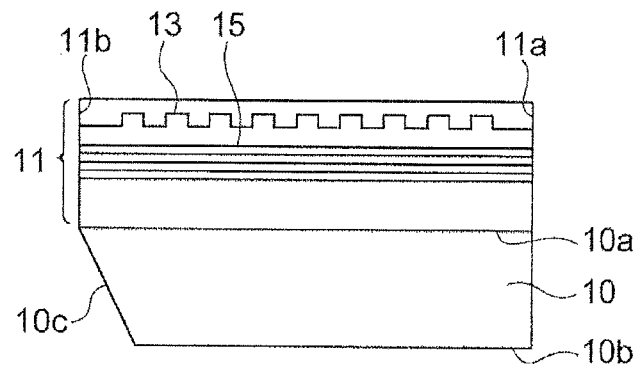
FIG. 7A and FIG. 7B are side views each showing a configuration of a modification example of the laser element main body in the quantum cascade laser.
Figure 7B:
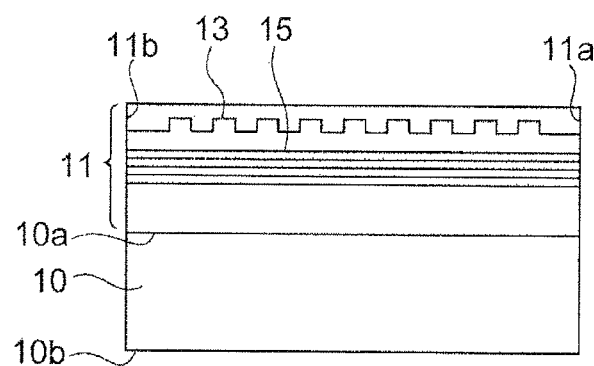

Here, regarding the output configuration to the outside of the light generated by the difference frequency generation in the laser element main body 1A of the quantum cascade laser 2A, the configuration has been exemplary shown in which the plurality of grooves 12 are provided on the substrate rear surface 10b in FIG. 1, FIG. 2, as described above; however, besides such a configuration, another configuration can be used. FIG. 7A and FIG. 7B are side views each showing a configuration of a modification example of the laser element main body in the quantum cascade laser 2A shown in FIG. 1.

In the configuration example shown in FIG. 7A, instead of the plurality of grooves 12 provided on the rear surface 10b of the semiconductor substrate 10, one end face of the substrate 10 is polished at a predetermined angle to make an output end face 10c (cf. e.g., Patent Document 1: International Publication No. WO 2014/018599). As an output configuration of the light generated by the difference frequency generation, such a configuration may be used. However, in this configuration in which the element end face is polished, the terahertz light that can be extracted to the outside is only the light generated in a range of about several hundred μm near the end face, due to absorption inside the substrate and the like.

In a case in which the output structure is not necessary such as the plurality of grooves 12 of the substrate rear surface 10b or the output end face 10c polished, depending on the configuration condition such as the wavelength of the light generated by the difference frequency generation, the output angle, and the semiconductor material used for the substrate 10, the quantum cascade laser may be configured to output the light without being provided with a special structure in the semiconductor substrate 10, as shown in FIG. 7B.

Figure 8:
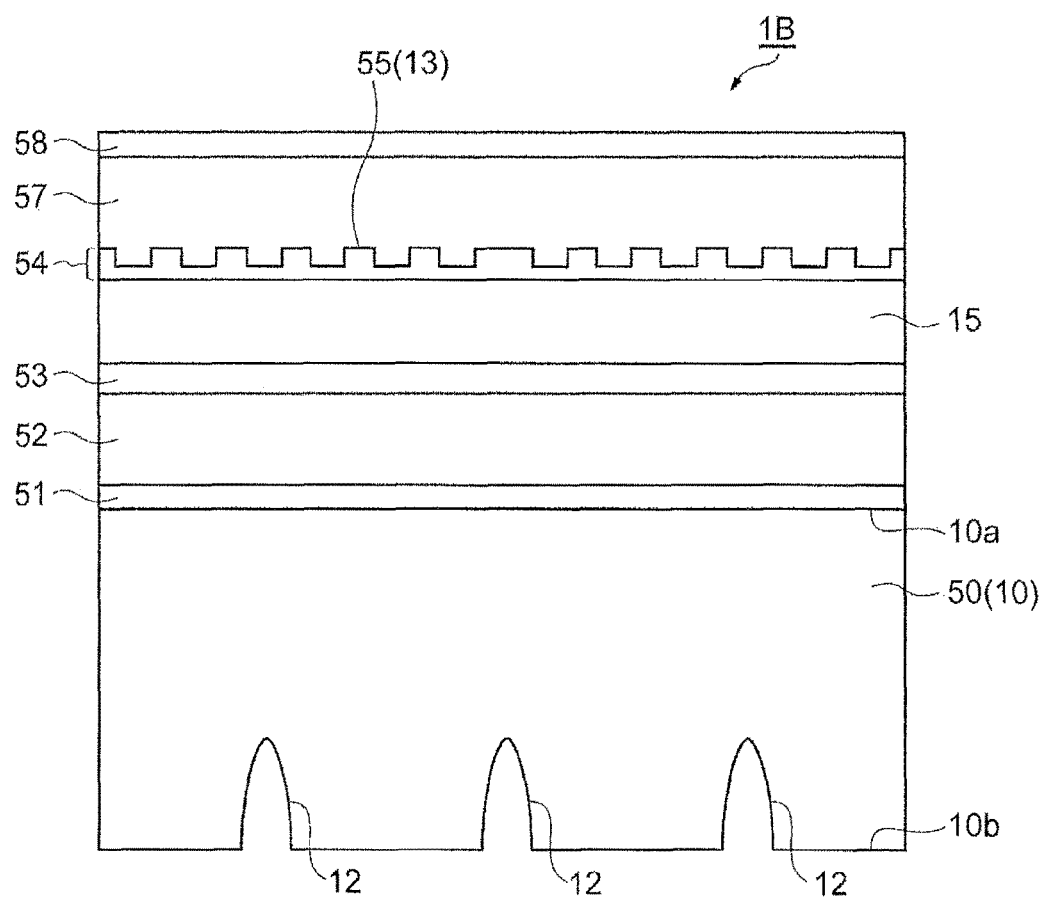
FIG. 8 is a side cross-sectional view showing an example of a specific configuration of the quantum cascade laser.
Figure 9:
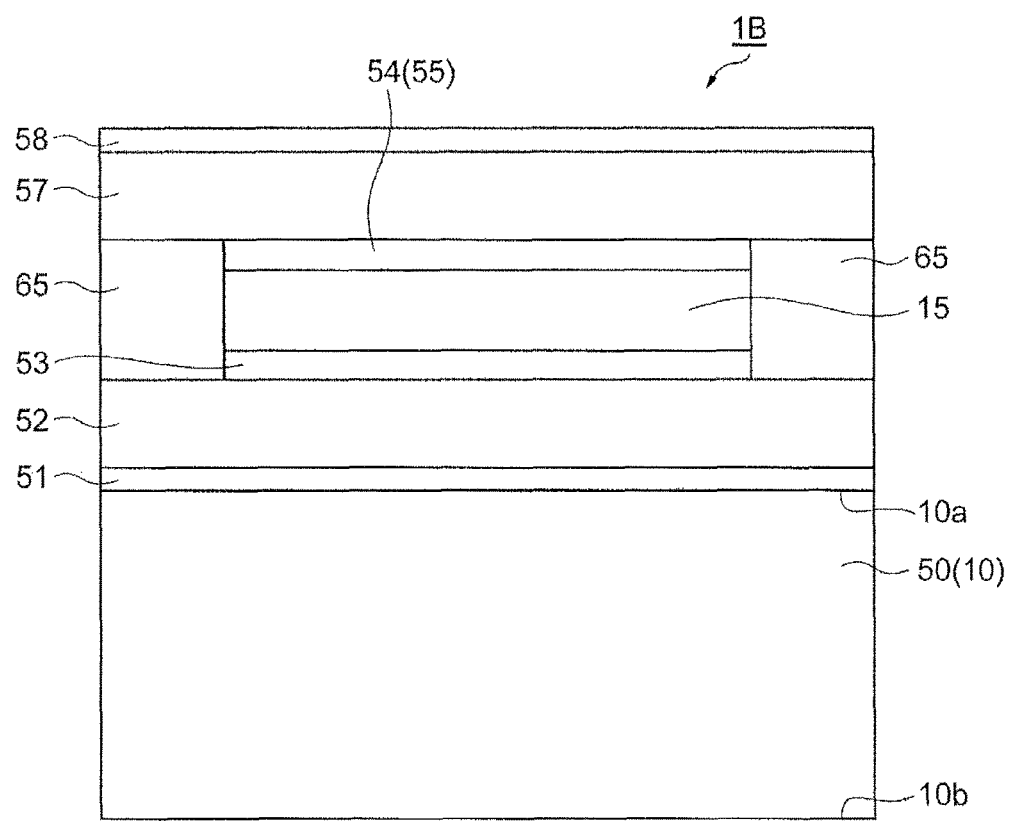
FIG. 9 is a front view showing the example of the specific configuration of the quantum cascade laser.
Figure 10:
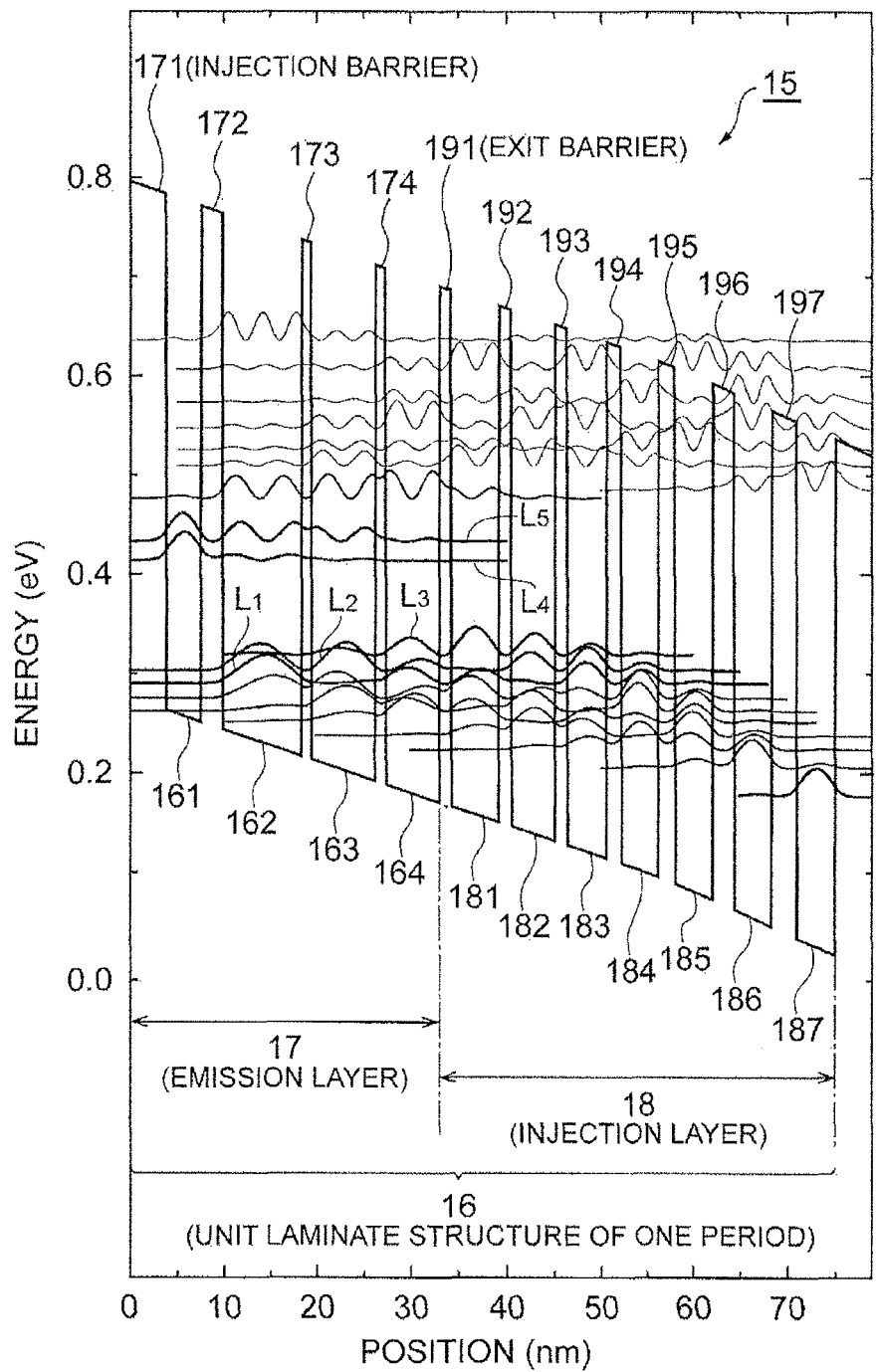
FIG. 10 is a diagram showing an example of a configuration of a unit laminate structure constituting the active layer.

The configuration of the quantum cascade laser will be further described along with a specific example of the element structure including the quantum well structure in the active layer. FIG. 8 is a side cross-sectional view showing a cross section along the resonating direction of an example of a specific configuration of the laser element main body in the quantum cascade laser. FIG. 9 is a front view showing the configuration of the laser element main body shown in FIG. 8, when viewed from the end face direction. FIG. 10 is a diagram showing an example of a configuration of the unit laminate structure constituting the active layer in the laser element main body of the quantum cascade laser shown in FIG. 8. FIG. 11 is a table showing an example of a structure of the unit laminate structure of one period in the active layer.

Here, FIG. 10 shows, for a part of the multistage repetition structure based on the emission layer 17 and the injection layer 18 in the active layer 15, the quantum well structure and the subband level structure in its operating electric field. The subband level structure shown in FIG. 10 is a specific example of the level structure shown in FIG. 3. The element structure shown in FIG. 8 to FIG. 11 can be formed by crystal growth, e.g., by the molecular beam epitaxy (MBE) method or by the metal organic chemical vapor deposition (MOCVD) method.

In the semiconductor laminate structure of an element main body 1B shown in FIG. 8 and FIG. 9, considering absorption of the terahertz light, a semi-insulating InP substrate 50 of the thickness t=150 μm is used as the semiconductor substrate 10. On the InP substrate 50, the element structure of the laser element main body 1B is formed by sequentially stacking, in order from the substrate side, a high concentration Si-doped (Si: $1.5\times10^{18}$ cm$^{-3}$) InGaAs lower contact layer 51 of the thickness of 400 nm, a Si-doped (Si: $1.5\times10^{16}$ cm$^{-3}$) InP lower cladding layer 52 of the thickness of 5 μm, a Si-doped (Si: $1.5\times10^{16}$ cm$^{-3}$)

InGaAs lower guide layer 53 of the thickness of 250 nm, the active layer 15 in which the unit laminate structures 16 are laminated by 40 periods, a Si-doped (Si: $1.5\times10^{16}$ cm$^{-3}$) InGaAs upper guide layer 54 of the thickness of 450 nm, a Si-doped (Si: $1.5\times10^{16}$ cm$^{-3}$) InP upper cladding layer 57 of the thickness of 5 µm, and a high concentration Si-doped (Si: $1.5\times10^{18}$ cm$^{-3}$) InP upper contact layer 58 of the thickness of 15 nm.

In the upper guide layer 54, as shown in FIG. 8, a diffraction grating structure 55 of the depth of 250 nm functioning as the internal diffraction grating 13 of the distributed feedback cavity for generating the second pump light of the second frequency $\omega_2$ is formed by etching.

The active layer 15 and the guide layers 53, 54, constituting the core layer portion in the waveguide structure including the cladding layers 52, 57, are formed, for example, in the form of the ridge stripe of the width of 12 µm along the resonating direction of the light, after forming the diffraction grating structure of the guide layer 54, as shown in FIG. 9. Fe-doped InP support layers 65 are formed by embedding regrowth with the MOCVD or the like, to cover both side walls of the ridge stripe. On the second surface 10b of the InP substrate 50, the plurality of grooves 12 are formed for outputting the terahertz light of the difference frequency $\omega$ generated by the difference frequency generation. Formation of an insulating film, formation of an electrode, and the like are further performed for this element structure, as needed.

As described above, the active layer 15 in the present configuration example is configured such that the unit laminate structures 16 each including the quantum well emission layer 17 and the electron injection layer 18 are laminated by 40 periods. In the present configuration example, the center wavelength of the gain in the active layer 15 is set to 10 µm. The unit laminate structure 16 of one period is configured as the quantum well structure in which eleven quantum well layers 161-164, 181-187, and eleven quantum barrier layers 171-174, 191-197 are alternately stacked, as shown in FIG. 10, FIG. 11.

In the respective semiconductor layers of the unit laminate structure 16, each of the quantum well layers is configured with an InGaAs layer lattice-matched with the InP substrate 50. Each of the quantum barrier layers is configured with an InAlAs layer lattice-matched with the InP substrate 50. In this configuration, the active layer 15 is configured by an InGaAs/InAlAs quantum well structure.

In the unit laminate structure 16, concerning the emission layer 17 and the injection layer 18, the laminate part consisting of four well layers 161-164 and barrier layers 171-174 in the laminate structure shown in FIG. 10 serves as a portion to function mainly as the emission layer 17. Furthermore, the laminate part consisting of seven well layers 181-187 and barrier layers 191-197 serves as a portion to function mainly as the injection layer 18. The quantum barrier layer 171 of the first stage, in the semiconductor layers of the emission layer 17, is an injection barrier layer.

In the present configuration example, regarding the exit barrier layer positioned between the emission layer 17 and the injection layer 18, there is no barrier layer effectively functioning as an exit barrier. In FIG. 10, the barrier layer 191 is formally defined as the exit barrier layer, and in its front and rear, the emission layer 17 and the injection layer 18 are functionally divided. In FIG. 11, a specific example is shown of a structure of the unit laminate structure 16 of one period in the active layer 15.

In the element main body 1B of the quantum cascade laser, in order to achieve generation of the terahertz light by the difference frequency generation, an active layer is required capable of generating pump light components of two wavelengths and having a high second-order nonlinear susceptibility $\chi^{(2)}$ for the pump light. In the active layer 15 of the present configuration example, generation of the first pump light of the frequency $\omega_1$ and the second pump light of the frequency $\omega_2$ in a single active layer design, generation of the terahertz light of the difference frequency $\omega$ by the difference frequency generation, and variable control of the frequency with the external diffraction grating 25 are achieved, by adopting the DAU/MS structure shown in FIG. 3 to use a wide gain bandwidth of the coupled dual upper level (DAU) structure, and by providing the distributed feedback cavity with the internal diffraction grating 13, and the external cavity with the external diffraction grating 25.

The subband level structure shown in FIG. 10 is designed such that electrons perform optical transitions from strongly coupled two upper levels $L_4$, $L_5$ to the plurality of lower levels $L_1$, $L_2$, $L_3$. Specifically, in the configuration example of FIG. 10, the energy interval between two upper levels $L_4$, $L_5$ is $\Delta E_{54}=18$ meV. The energy intervals between other levels are $\Delta E_{53}=121$ meV, $\Delta E_{52}=136$ meV, $\Delta E_{51}=149$ meV, $\Delta E_{43}=102$ meV, $\Delta E_{42}=117$ meV, and $\Delta E_{41}=131$ meV.

In this configuration, electrons injected from the injection layer of the preceding stage into the emission layer 17 are equally distributed to the upper levels $L_4$, $L_5$ by high-speed electron-electron scattering or the like, and the two upper levels $L_4$, $L_5$ behave as if they were extended single upper level. Therefore, the gain by transitions from the upper level $L_4$ to the lower levels $L_1$ to $L_3$ and the gain by transitions from the upper level $L_5$ to the lower levels $L_1$ to $L_3$ overlap with each other in equivalent contribution, and a unimodal and wide band gain spectrum is obtained.

In this configuration in which a single active layer structure is used, different from the configuration in which the plurality of active layer structures are stacked, a uniform nonlinear optical characteristic is obtained over the entire region of the active layer, thereby enabling achieving high efficiency wavelength conversion. When defining assumed carrier concentrations in the levels $L_1$ to $L_5$ as $n_1$ to $n_5$ respectively and assuming $n_1=n_2=n_3$, and using conditions $n_5-n_i=1.0\times10^{15}$ cm$^{-3}$, $n_4-n_i=1.3\times10^{15}$ cm$^{-3}$ (i=1, 2, 3), as an absolute value of the total of the second-order nonlinear susceptibility $\chi^{(2)}$ generated by the DAU structure, $|\chi^{(2)}|=23.3$ nm/V is obtained.

The frequencies $\omega_1$, $\omega_2$ of the pump light, the frequency $\omega=|\omega_1-\omega_2|$ of the terahertz output light, the variable range of the frequency $\omega$ of the terahertz light, and the like are determined by design of the diffraction grating structure 55 being the internal diffraction grating 13, and the external diffraction grating 25. In the present configuration example, the first pump light of the frequency $\omega_1$ and the second pump light of the frequency $\omega_2$ are both made to operate in a single mode by using the distributed feedback cavity structure, the external cavity structure with the diffraction gratings 13, 25, and by this configuration, the terahertz output light is made to operate in the single mode.

Figure 12:
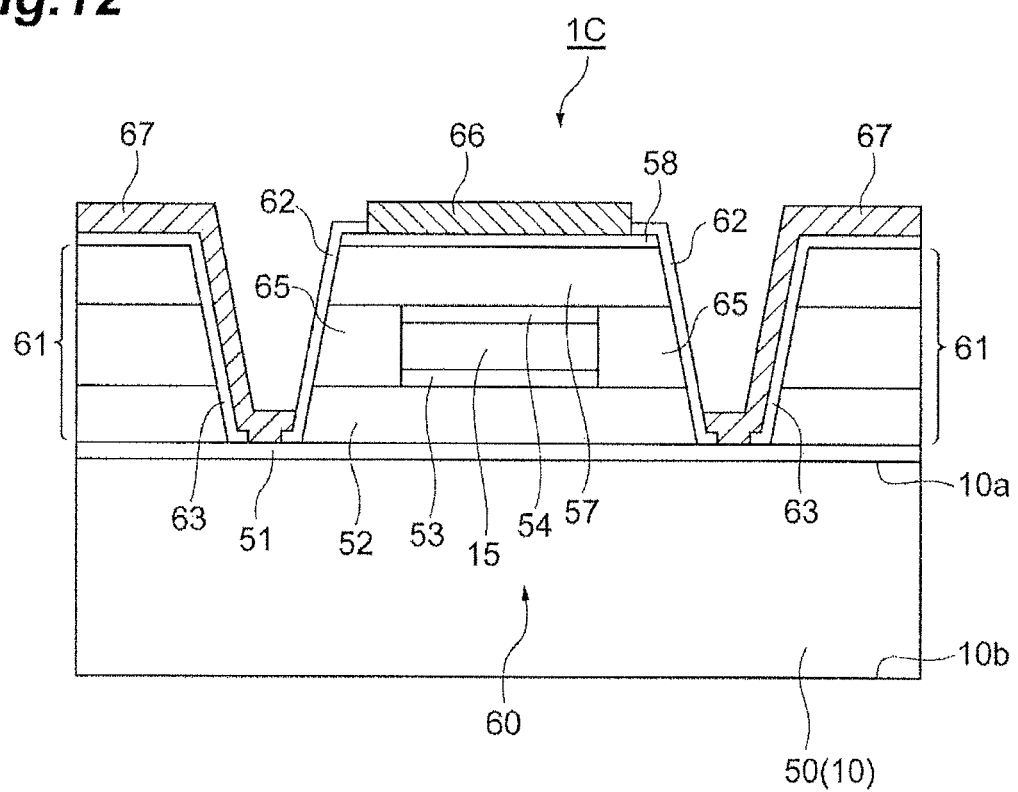
FIG. 12 is a front view showing an example of an element structure of the quantum cascade laser.

The specific configuration of the quantum cascade laser will be further described. FIG. 12 is a front view showing an example of an element structure of the quantum cascade laser. In a laser element main body 1C of the quantum cascade laser in the present configuration example, etching is performed for exposing the lower contact layer 51 of the InP substrate 50 side for the element structure shown in FIG. 8, FIG. 9, to form an element structure portion 60 including the active layer 15 and the like and corresponding to the element structure portion 11 on the substrate 10, and support structure portions 61 of both sides thereof.

A SiN insulating layer 62 is provided to cover the element structure portion 60, and an upper electrode 66 is formed electrically connected to the upper contact layer 58 through a contact hole of the insulating layer 62. A SiN insulating layer 63 is provided to cover the support structure portion 61, and a lower electrode 67 is formed electrically connected to the lower contact layer 51 through the contact hole between the insulating layers 62, 63. These electrodes 66, 67 can be formed by, for example, forming a thick Au film of the thickness of about 5 μm by evaporation and plating method and then separating the upper and lower electrodes from each other by etching.

In this formation of the element structure, regarding the etching method, any methods may be used of the wet etching and the dry etching. Also regarding fine patterning, any methods may be used, as far as they are capable of processing of the desired size, such as the interference exposure method, and the nanoimprint method.

Figure 13:
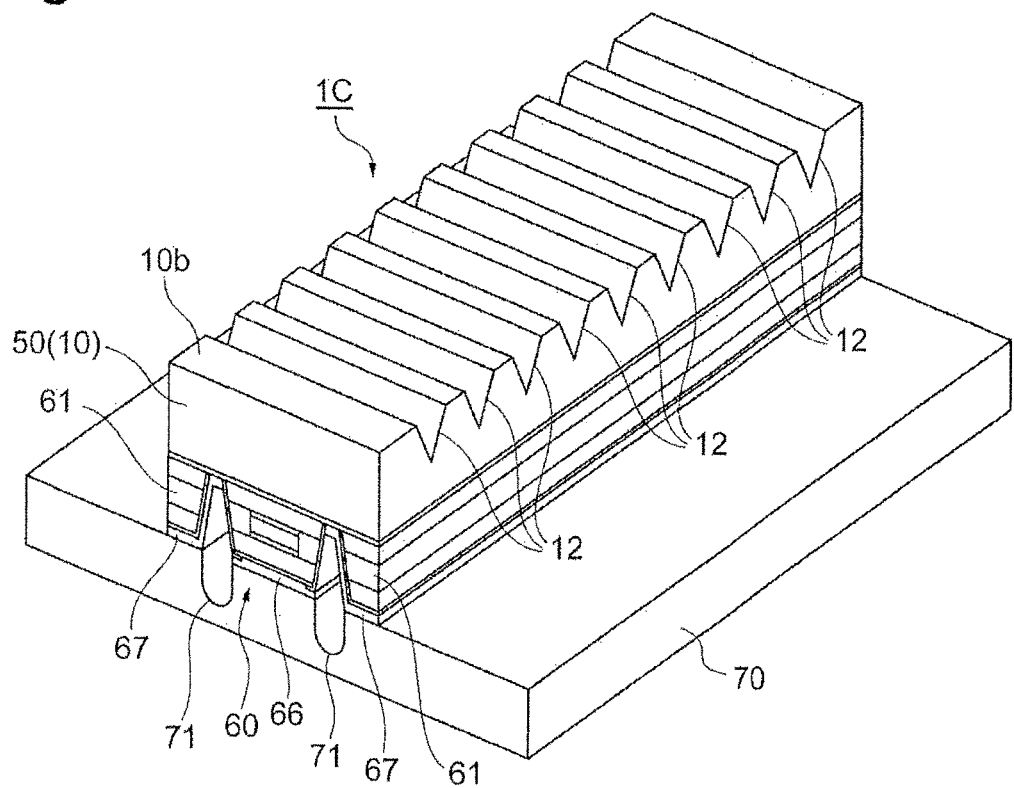
FIG. 13 is a perspective view showing another example of the element structure of the quantum cascade laser.

FIG. 13 is a perspective view showing another example of the element structure of the quantum cascade laser. In the element main body 1C of the quantum cascade laser of the configuration shown in FIG. 12, the terahertz light generated by the difference frequency generation is emitted to the substrate 50 side at the emission angle θc with respect to the resonating direction of the pump light as shown in FIG. 2. Considering this point, so-called epi-down assembly is preferably used, in which the assembly is performed so that the rear surface 10b on which the grooves 12 are formed in the substrate 50 of the element main body 1C of the quantum cascade laser is the upper side, as shown in FIG. 13.

In the configuration example shown in FIG. 13, an assembly example of the laser element is shown, in which a sub-mount 70 is used in which the bonding pad is divided by grooves 71 so that the upper electrode 66 and the lower electrode 67 are not connected to each other, and the laser element main body 1C is arranged on the sub-mount 70. This configuration facilitates wire bonding, and facilitates arrangement of the optical system.

The cavity structure in the distributed feedback cavity with the internal diffraction grating 13 and in the external cavity with the external diffraction grating 25, setting conditions of the first, second frequencies $\omega_1$, $\omega_2$ of the first, second pump light components, and the like in the quantum cascade laser of the above configuration will be further described.

Figure 14:
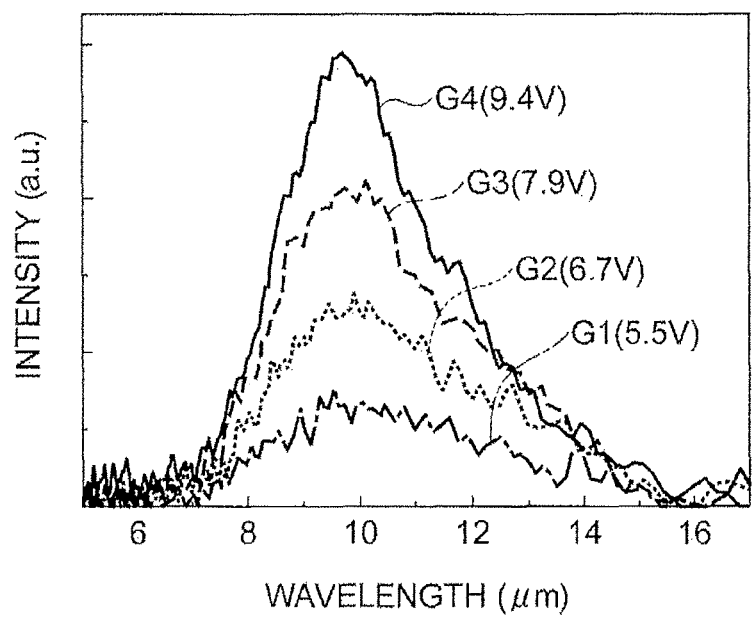
FIG. 14 is a graph showing emission spectra obtained by the quantum cascade laser.

FIG. 14 is a graph showing emission spectra obtained by the quantum cascade laser of the above configuration. In the graph, the horizontal axis represents the wavelength (μm), and the vertical axis represents the emission intensity (a.u.). In FIG. 14, graphs G1 to G4 show emission spectra with applied voltages of 5.5 V, 6.7 V, 7.9 V, 9.4 V, respectively. Here, the emission spectra are shown of electroluminescence (EL) at room temperature of the mid-infrared light when observed from end face direction of the laser element configured so that the cavity length is 3 mm. Regarding the operation condition of the laser element, the laser element is operated in pulse operation at operation temperature 300 K, repetition frequency 100 kHz, and pulse width 500 ns.

As shown in these graphs G1 to G4, unimodal and wide band emission spectra are obtained by using the above DAU/MS structure in the active layer 15. The center wavelength of the emission spectrum is 10 μm, and the full width at half maximum of the spectrum is about 400 nm. In this case, the gain spectrum and the emission spectrum of the EL shown in FIG. 14 can be regarded as being almost coincident with each other.

Regarding the configuration of the internal diffraction grating 13 to be used for the distributed feedback cavity for generating the second pump light of the frequency $\omega_2$, the second frequency $\omega_2$ selected by the internal diffraction grating 13 is set so as to be a frequency and a wavelength not coincident with those of the gain peak, for the gain spectrum of emission shown in FIG. 14. Specifically, as described above, the frequency $\omega_2$ of the second pump light determined by the internal diffraction grating 13 is preferably set to a frequency at which intensity in the gain spectrum is 60% or more and 90% or less compared to that at the gain peak.

Figure 15:
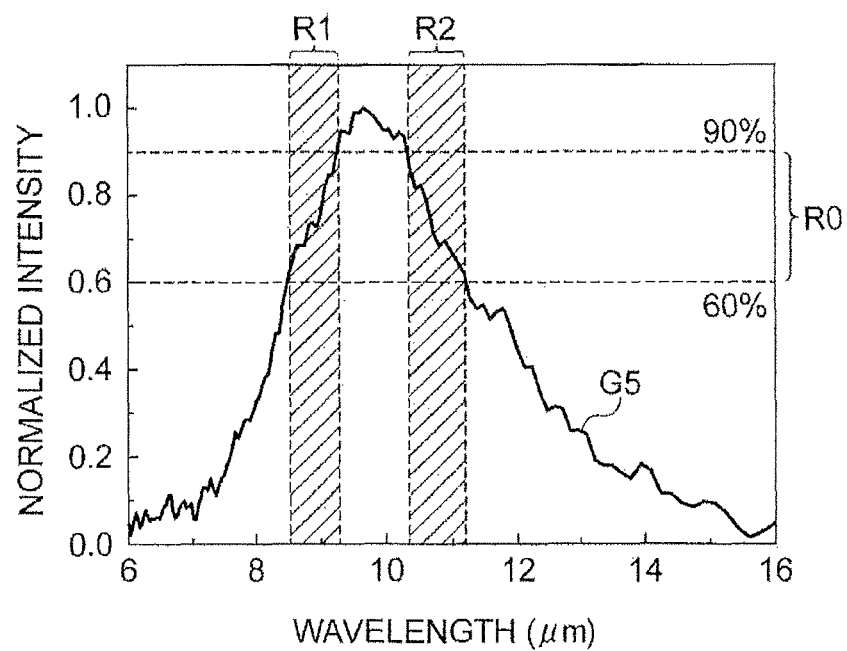
FIG. 15 is a graph showing an emission spectrum, and a setting of a resonance frequency obtained by the quantum cascade laser.

FIG. 15 is a graph showing an emission spectrum, and a setting of a resonance frequency obtained by the quantum cascade laser. In FIG. 15, a graph G5 shows the gain spectrum (emission spectrum) normalized by the gain peak. A region R0 for the normalized intensity of the vertical axis shows a range in which relative intensity to the gain peak is 60% or more and 90% or less. A region R1 for the wavelength of the horizontal axis shows a wavelength range (frequency range) in which the normalized intensity is 60% or more and 90% or less in the short wavelength (high frequency) side, and a region R2 shows a wavelength range (frequency range) in which the normalized intensity is 60% or more and 90% or less in the long wavelength (low frequency) side. The second frequency $\omega_2$ by the internal diffraction grating 13 is preferably set in these regions R1, R2.

Here, when the oscillation wavelength selected by the distributed feedback cavity with the internal diffraction grating 13 is set near the gain peak, feedback is strongly applied, so that a single mode oscillation is obtained. For this reason, such wavelength setting is necessary in optical communication, laser spectroscopy, and the like in which excellent monochromaticity is required.

On the other hand, in the quantum cascade laser of the above configuration, in order to generate the terahertz light by the difference frequency generation, it is necessary to oscillate the mid-infrared pump light in two wavelengths at the same time. Therefore, regarding the internal diffraction grating 13, it is necessary to configure the diffraction grating so that DFB oscillation occurs at a wavelength at a certain distance from the gain peak, and to make a situation in which a DFB mode and a plurality of Fabry-Perot modes by the cavity formed with the end faces of the element structure portion 11 are mixed.

Furthermore, when the oscillation wavelength in the distributed feedback cavity with the internal diffraction grating 13 is too far from the gain peak, the DFB oscillation itself becomes difficult. Considering these points, as described above, the oscillation wavelength (oscillation frequency $\omega_2$) by the internal diffraction grating 13 is preferably set in the regions R1 and R2 in which the intensity in the gain spectrum is 60% or more and 90% or less with respect to the intensity at the gain peak.

Here, the wavelength of the light selected by the internal diffraction grating 13 may be set in any of the inside of the region R1 of the short wavelength side to the peak wavelength of the gain peak and the inside of the region R2 of the long wavelength side, and, for example, the wavelength can be appropriately selected in which the diffraction grating structure 55 functioning as the internal diffraction grating 13 is easily formed. The diffraction grating structure 55 may be formed partially to the resonating direction in the laser cavity structure, and, alternatively, the diffraction grating structure 55 may be formed over the entire region.

Regarding the configuration of the external diffraction grating 25 to be used for the external cavity for generating the first pump light of the frequency $\omega_1$, it is configured so that single mode oscillation is obtained at the first frequency $\omega_1$ by using the external cavity, from the plurality of Fabry-Perot modes that are mixed with the DFB mode, as described above. As the configuration of the external cavity, for example, well-known Littrow configuration may be used.

As the collimating lens 20 (cf. FIG. 1) for making the light emitted from the laser element main body be parallel light and guiding the light to the diffraction grating 25, for example, an aspherical lens made of a material such as ZnSe can be used, and low reflection coating is applied to both surfaces with a dielectric multilayer film in which transmittance is 90% or more for the light of the wavelength of 4-12 µm. In such collimating lens 20, for example, it is preferable that the focal length is 10 mm or less, and the numerical aperture NA is 0.8 or more.

As for the external diffraction grating 25, it is preferable that a reflection type blazed diffraction grating is used, and, for example, the groove density is 100 lines/mm or more, surface Au coating is applied, and the diffraction efficiency is 60% or more in a wavelength range in which lasing is possible.

In order to stabilize the oscillation by the external cavity using the external diffraction grating 25 and widen the variable range of the frequency (wavelength) by the diffraction grating 25, it is preferable that the reflection reducing film 21 such as the low reflection coating for the mid-infrared pump light is provided on the first end face 11*a* of the diffraction grating 25 side of the element structure portion 11, as shown in FIG. 4. Thus, reflectance for the light at the first end face 11*a* can be reduced from the state of the cleaved end face (reflectance of about 28%), and coupling efficiency with the diffraction grating 25 can be improved.

In the above configuration using the active layer 15 of the DAU/MS structure, the unimodal and wide band emission spectrum is obtained, as shown in FIG. 14. For this reason, the reflection reducing film 21 can be configured so as to reduce the reflectance for the light of the frequency of the gain peak. Regarding the configuration of the reflection reducing film 21, specifically, the low reflection coating can be used of the dielectric multilayer film, or the dielectric single layer film of the thickness of $\lambda p/4n$. Here, $\lambda p$ is the wavelength of the gain peak, and n is the refractive index of the coating material.

As the coating material of the reflection reducing film 21, a material is preferably used having insulation, and a low refractive index and transparency for the light of the wavelength of 10 µm. As for the material, for example, $CeO_2$ can be suitably used of the refractive index of 1.52 for the light of the wavelength 10 µm. In this case, when the $CeO_2$ film is formed with the film thickness of about 1.6 µm that is $\lambda p/4n$, the reflectance 2.6% is obtained. According to this configuration, a low reflectance of a few percent can be obtained with a simple configuration of single layer coating with a realistic film thickness.

On the other hand, regarding the second end face 11*b* opposite to the external diffraction grating 25 of the element structure portion 11, the reflection film 22 such as high reflection coating for the mid-infrared pump light is preferably provided, as shown in FIG. 4. The reflection film 22 may be configured so as to increase the reflectance for the light of the frequency of the gain peak, similarly to the reflection reducing film 21.

Here, in the laser element of the normal distributed feedback cavity type, it is necessary to perform strong feedback by the diffraction grating provided near the active layer, and in order to suppress the effect as the cavity by the element end faces, a configuration is used for reducing the reflectance of the light in both end faces. In the laser element of the external cavity type, since the output light is extracted to the outside from the element end face opposite to the external diffraction grating, a configuration is used in which the high reflection coating is not provided to the end face.

On the other hand, in the quantum cascade laser of the above configuration, since the pump light components of two wavelengths to be used for generating the terahertz light by the difference frequency generation are oscillated at the same time, it is necessary to leave the effect as the cavity by the element end faces. In addition, since the terahertz output light is output to the outside from the rear surface 10*b* side of the semiconductor substrate 10, the configuration is not necessary such as the configuration of extracting the light from the element end face opposite to the external diffraction grating; therefore, the configuration is possible in which the reflection film 22 is formed on the second end face 11*b* as described above.

As the reflection film 22, specifically, for example, the $CeO_2$ film having insulation and transparency for the light of the wavelength of 10 µm is made to be a first layer, and a metal film such as an Au film is formed on the first layer, so that the high reflection coating of the reflectance of almost 100% can be achieved. In this way, by providing the reflection film 22 on the end face 11*b* of the element structure portion 11, a lot of light is confined in the active layer 15 and the amount of light can be increased of the pump light contributing the difference frequency generation; therefore, the output light such as the terahertz light can be increased.

According to the configuration in which the reflection reducing film 21, reflection film 22 are respectively provided on the end faces 11*a*, 11*b* of the element structure portion 11, the oscillation state can be suitably achieved in which the DFB mode and the Fabry-Perot mode are mixed. In this case, the oscillation threshold is lowered by reduction of the mirror loss, and deterioration of the element characteristics due to heat generation and the like can be suppressed. In addition, by the low threshold of the laser element, CW oscillation at room temperature is possible.

Figure 16:
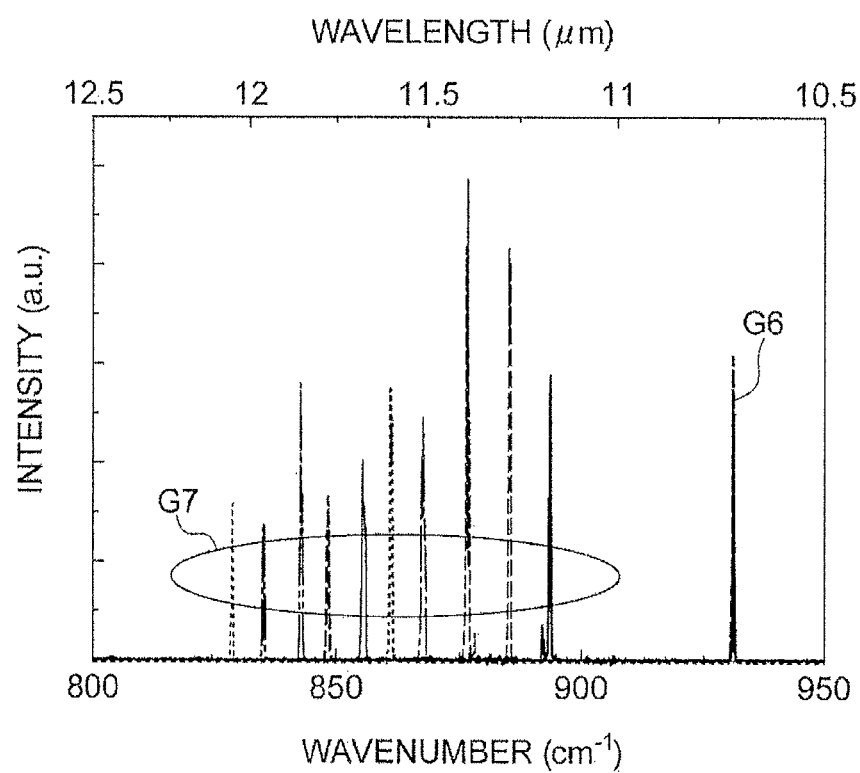
FIG. 16 is a graph showing an oscillation spectrum of the quantum cascade laser.

FIG. 16 is a graph showing an oscillation spectrum of the quantum cascade laser in room temperature pulse drive (100 kHz/200 ns). In the graph, the horizontal axis represents the wavenumber ($cm^{-1}$) or wavelength (µm), and the vertical axis represents the emission intensity (a.u.). In FIG. 16, a graph G6 shows an oscillation spectrum by the distributed feedback cavity using the internal diffraction grating 13, and a plurality of graphs (a plurality of peaks) of G7 shows each oscillation spectrum of when the frequency is changed in the external cavity using the external diffraction grating 25.

In the graph of FIG. 16, in contrast with the second pump light near the wavenumber of 930 $cm^{-1}$ by the distributed feedback cavity, the wavenumber of the first pump light by the external cavity varies in a range of 829 to 893 $cm^{-1}$. In the quantum cascade laser of the above configuration, the terahertz output light is generated by the difference frequency generation using the first pump light, second pump light, and as a result, the frequency of the terahertz light to be obtained can be made to be variable in a wide band of 1 to 3 THz.

The quantum cascade laser according to the present invention is not limited to the above-described embodiment and configuration examples, and can be variously modified. For example, in the above embodiment, the quantum cascade laser has the configuration in which three emission lower levels are provided for the first, second emission upper levels in the subband level structure of the active layer 15; however, the number of emission lower levels may be, for example, two, or may be four or more. In order to suitably generate the first pump light and the second pump light having different frequencies, the number of the emission lower levels is preferably three or more.

In the above-described configuration example, although the semi-insulating InP substrate is used as the semiconductor substrate 10, for example, an undoped InP substrate (Si: ~$5\times10^{15}$ cm$^{-3}$), or a low-doped InP substrate (Si: $5\times10^{15}$~$1\times10^{17}$ cm$^{-3}$) may be used as the substrate 10. When these substrates are used, a configuration becomes possible in which an electrode is provided on the substrate rear surface. However, when the doping concentration in the substrate is increased, since absorption of light inside the substrate is increased, intensity of the terahertz light output to the outside is decreased.

In the above-described configuration example, although the active layer is shown configured to be lattice matched with the InP substrate, a configuration in which distortion compensation is introduced may be used for the active layer. In the above-described configuration example, although the example has been shown in which the InP substrate is used as the semiconductor substrate and the active layer is configured with InGaAs/InAlAs, various configurations may be used specifically, as far as they are capable of intersubband emission transitions in the quantum well structure, and capable of achieving generation of the above-described first pump light, second pump light, and generation of the output light by the difference frequency generation.

As for the semiconductor material systems, it is possible to use a variety of material systems, e.g., such as GaAs/AlGaAs, InAs/AlSb, GaN/AlGaN, and SiGe/Si, besides above-described InGaAs/InAlAs. Further, various methods may be used as crystal growth methods of semiconductors.

Regarding the laminate structure in the active layer of the quantum cascade laser and the semiconductor laminate structure as the entire laser element, various structures may be used besides the above-described structure. In general, the quantum cascade laser only needs to include the semiconductor substrate and the active layer of the above configuration provided on the first surface of the semiconductor substrate, and to be provided with the external diffraction grating constituting the external cavity for generating the first pump light and configured to be capable of changing the first frequency $\omega_1$, outside the element structure portion including the active layer, and to be provided with the internal diffraction grating constituting the distributed feedback cavity for generating the second pump light, inside the element structure portion, in which the second frequency $\omega_2$ determined by the internal diffraction grating is set to be fixed at the frequency not coincident with the gain peak, and the first frequency $\omega_1$ determined by the external diffraction grating is set to be variable at the frequency different from the second frequency $\omega_2$.

Regarding the resonance frequency variation mechanism provided for the external diffraction grating, the rotation stage for rotationally driving the diffraction grating is exemplary shown in the above embodiment; however, besides such a configuration, a variation mechanism of another configuration may be used.

The quantum cascade laser of the above embodiment includes (1) a semiconductor substrate; and (2) an active layer provided on a first surface of the semiconductor substrate and having a cascade structure in which quantum well emission layers and injection layers are alternately stacked in the form of a multistage lamination of unit laminate structures each of which includes the quantum well emission layer and the injection layer, wherein (3) the active layer is configured with a single active layer structure, and the unit laminate structure includes a first emission upper level, a second emission upper level having a higher energy than the first emission upper level, and a plurality of emission lower levels each of which has a lower energy than the first emission upper level, in a subband level structure based on the quantum well structure, and (4) the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light, and (5) an external diffraction grating is provided constituting an external cavity for generating the first pump light for feeding the light of the first frequency $\omega_1$ back to an element structure portion and configured to be capable of changing the first frequency $\omega_1$, outside the element structure portion including the active layer provided on the first surface of the semiconductor substrate, and an internal diffraction grating is provided constituting a distributed feedback cavity for generating the second pump light of the second frequency $\omega_2$, inside the element structure portion, and (6) the second frequency $\omega_2$ determined by the internal diffraction grating is set to be fixed to a frequency not coincident with a gain peak in a gain spectrum, and the first frequency $\omega_1$ determined by the external diffraction grating is set to be variable to a frequency different from the second frequency $\omega_2$.

Here, in the above configuration, the second frequency $\omega_2$ determined by the internal diffraction grating of the distributed feedback cavity is preferably set to a frequency at which the intensity at the second frequency $\omega_2$ in the gain spectrum is 60% or more and 90% or less compared to the gain peak. According to this configuration, the first pump light and the second pump light can be suitably generated by appropriately setting the first, second frequencies $\omega_1$, $\omega_2$ by the external diffraction grating and the internal diffraction grating.

The cavity structure in the quantum cascade laser is preferably configured so that the reflection reducing film (low reflection film) is formed for reducing the reflectance for the light of the frequency of the gain peak, on the first end face of the external diffraction grating side of the element structure portion. The cavity structure is preferably configured so that the reflection film (high reflection film) is formed for increasing the reflectance for the light of the frequency of the gain peak, on the second end face opposite to the external diffraction grating of the element structure portion.

In the above configuration, the quantum cascade laser may be configured so that the plurality of grooves, respectively formed in the direction intersecting with the resonating direction in the laser cavity structure, are provided on the second surface opposite to the first surface of the semiconductor substrate. According to this configuration, the light such as the terahertz light generated by the difference frequency generation in the active layer can be suitably output to the outside, by making each of side surfaces of the grooves provided on the substrate rear surface function as the output surface of the output light.

The present invention can be used as the quantum cascade laser capable of suitably generating and outputting the light such as the terahertz light, by the difference frequency generation.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
    a semiconductor substrate; and
    an active layer provided on a first surface of the semiconductor substrate and having a cascade structure in which quantum well emission layers and injection layers are alternately stacked in the form of a multi-stage lamination of unit laminate structures each of which comprises the quantum well emission layer and the injection layer, wherein
    the active layer is configured with a single type of active layer structure, and the unit laminate structure includes a first emission upper level, a second emission upper level having a higher energy than the first emission upper level, and a plurality of emission lower levels each of which has a lower energy than the first emission upper level, in a subband level structure by a quantum well structure,
    the active layer is configured to be capable of generating first pump light of a first frequency $\omega_1$ and second pump light of a second frequency $\omega_2$ by intersubband emission transitions of electrons, and to generate output light of a difference frequency $\omega$ between the first frequency $\omega_1$ and the second frequency $\omega_2$ by difference frequency generation from the first pump light and the second pump light,
    an external diffraction grating is provided constituting an external cavity for generating the first pump light by feeding the light of the first frequency $\omega_1$ back to an element structure portion and configured to be capable of changing the first frequency $\omega_1$, outside the element structure portion including the active layer provided on the first surface of the semiconductor substrate, and an internal diffraction grating is provided constituting a distributed feedback cavity for generating the second pump light of the second frequency $\omega_2$, inside the element structure portion, and
    the second frequency $\omega_2$ determined by the internal diffraction grating is set to be fixed to a frequency not coincident with a gain peak in a gain spectrum, and the first frequency $\omega_1$ determined by the external diffraction grating is set to be variable to a frequency different from the second frequency $\omega_2$, and wherein
    a reflection film is formed for increasing reflectance for the light of the frequency of the gain pea, on a second end face of the side opposite to the external diffraction grating of the element structure portion,
    a plurality of grooves respectively formed in a direction intersecting with a resonating direction in a laser cavity structure are provided on a second surface opposite to the first surface of the semiconductor substrate,
    each of side surfaces of the plurality of grooves functions as an output surface for the output light, and
    the output light is refracted on the interface between the semiconductor and the outside on the side surface of the groove to be extracted to the outside.

2. The quantum cascade laser according to claim 1, wherein the second frequency $\omega_2$ determined by the internal diffraction grating is set to a frequency at which intensity in the gain spectrum is 60% or more and 90% or less compared to the gain peak.

3. The quantum cascade laser according to claim 1, wherein a reflection reducing film is formed for reducing reflectance for the light of the frequency of the gain peak, on a first end face of the external diffraction grating side of the element structure portion.

* * * * *